US011003143B2

(12) United States Patent
Kim et al.

(10) Patent No.: US 11,003,143 B2
(45) Date of Patent: May 11, 2021

(54) PHASE LOCKED LOOP CIRCUITS, CLOCK SIGNAL GENERATORS COMPRISING DIGITAL-TO-TIME CONVERT CIRCUITS, OPERATING METHODS THEREOF AND WIRELESS COMMUNICATION DEVICES

(71) Applicant: Samsung Electronics Co., Ltd., Suwon-si (KR)

(72) Inventors: Shin-woong Kim, Suwon-si (KR); Jae-young Kim, Hwaseong-si (KR); Chul-ho Kim, Hwaseong-si (KR); Jae-hyuk Jang, Seoul (KR); Sang-wook Han, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/818,276

(22) Filed: Mar. 13, 2020

(65) Prior Publication Data
US 2020/0218203 A1 Jul. 9, 2020

Related U.S. Application Data

(63) Continuation of application No. 16/374,236, filed on Apr. 3, 2019, now Pat. No. 10,606,217.

(30) Foreign Application Priority Data

Apr. 6, 2018 (KR) .................. 10-2018-0040602

(51) Int. Cl.
*G04F 10/00* (2006.01)
*H04L 7/00* (2006.01)
(Continued)

(52) U.S. Cl.
CPC .......... *G04F 10/005* (2013.01); *H03L 7/0802* (2013.01); *H03L 7/0893* (2013.01); *H04B 17/14* (2015.01); *H04L 7/0087* (2013.01)

(58) Field of Classification Search
CPC ......... G04F 10/005; H03L 7/08; H03L 7/081; H03L 7/033; H03L 7/20; H03L 7/091; H03L 7/06; H03L 7/089
(Continued)

(56) References Cited

U.S. PATENT DOCUMENTS

| 4,280,099 A * | 7/1981 | Rattlingourd ......... H04L 7/0331 327/160 |
| 6,381,291 B1 * | 4/2002 | Yom .................... H03D 13/003 327/147 |

(Continued)

FOREIGN PATENT DOCUMENTS

EP 2782255 9/2014

OTHER PUBLICATIONS

Gao, Xiang et al.; A 2.7-to4.3GHz, 0.16psrms-Jitter, −246.8dB-FOM, Digital Fractional-N Sampling PLL in 28nm CMOS; ISSCC 2016/Session 9/ High-Performance Wireless/ 9.6; 2016.
(Continued)

*Primary Examiner* — Lam T Mai
(74) *Attorney, Agent, or Firm* — Harness, Dickey & Pierce, P.L.C.

(57) ABSTRACT

Provided is clock signal generator configured to generate a target output clock signal based on a reference clock signal, the clock signal generator includes a digital-to-time converter (DTC) configured to delay a reference clock signal based on an input code to generate a delay clock signal, and output the delay clock signal, a DTC controller configured to determine an initial gain value of the DTC based on a result of comparing at least one delay amount of the DTC with a period of a previously generated output clock signal, and generate the input code based on the initial gain value, and a phase locked loop configured to generate the target output clock signal based on the delay clock signal and a
(Continued)

division clock signal of the previously generated output clock signal, the target output clock signal being locked to the delay clock signal.

20 Claims, 13 Drawing Sheets

(51) Int. Cl.
*H03L 7/089* (2006.01)
*H03L 7/08* (2006.01)
*H04B 17/14* (2015.01)

(58) Field of Classification Search
USPC .................................................. 341/120–155
See application file for complete search history.

(56) References Cited

U.S. PATENT DOCUMENTS

| | | | |
|---|---|---|---|
| 6,570,454 B2 * | 5/2003 | Skierszkan | ............... H03L 7/07 |
| | | | 327/147 |
| 7,978,800 B2 * | 7/2011 | Douma | .................. H04L 7/033 |
| | | | 375/354 |
| 9,207,646 B2 | 12/2015 | Wang et al. | |
| 9,455,667 B2 | 9/2016 | Vlachogiannakis et al. | |
| 9,678,481 B1 | 6/2017 | Gao et al. | |
| 9,735,952 B2 | 8/2017 | Ravi et al. | |
| 9,791,834 B1 | 10/2017 | Nassar et al. | |
| 10,606,217 B2 * | 3/2020 | Kim | ....................... H03L 7/0802 |
| 2011/0156783 A1 * | 6/2011 | Pavlovic | .................... H03L 7/18 |
| | | | 327/159 |
| 2013/0033293 A1 * | 2/2013 | Zhang | ................... H03L 7/1976 |
| | | | 327/156 |
| 2013/0169327 A1 * | 7/2013 | Helio | ..................... G04F 10/105 |
| | | | 327/156 |
| 2015/0381337 A1 | 12/2015 | Madoglio et al. | |
| 2016/0056825 A1 * | 2/2016 | Vlachogiannakis | .. H03M 1/201 |
| | | | 327/142 |
| 2016/0056827 A1 * | 2/2016 | Vlachogiannakis | ........................ |
| | | | H03B 5/1296 |
| | | | 327/158 |
| 2016/0182072 A1 * | 6/2016 | Preyler | ...................... H03L 7/16 |
| | | | 327/105 |
| 2017/0205772 A1 * | 7/2017 | Burg | ...................... H03L 7/0991 |
| 2017/0364034 A1 | 12/2017 | Gao et al. | |

OTHER PUBLICATIONS

Raczkowski, Kuba et al.; A 9.2-12.7 GHz Wideband Fractional-N Subsampling PLL in 28 nm CMOS With 280 fs RMS Jitter; IEEE Journal of Solid-State Circuits, vol. 50, No. 5, May 2015.
Notice of Allowance dated Nov. 22, 2019 in U.S. Appl. No. 16/374,236.

* cited by examiner

PHASE LOCKED LOOP CIRCUITS, CLOCK SIGNAL GENERATORS COMPRISING DIGITAL-TO-TIME CONVERT CIRCUITS, OPERATING METHODS THEREOF AND WIRELESS COMMUNICATION DEVICES

CROSS-REFERENCE TO RELATED APPLICATIONS

This application is a Continuation of U.S. application Ser. No. 16/374,236, filed on Apr. 3, 2019, which claims the benefit of Korean Patent Application No. 10-2018-0040602, filed on Apr. 6, 2018, in the Korean Intellectual Property Office, the disclosure of each of which is incorporated herein in its entirety by reference.

BACKGROUND

The inventive concepts relate to semiconductor circuits including digital-to-time converter (DTC) circuits, and more particularly, to phase locked loop circuits, clock signal generator including DTC circuits, a methods of operating the phase locked loop circuits and the clock signal generators, and wireless communication devices.

A DTC generates delayed clock signals by delaying reference clock signals that are input according to received digital codes. The DTC may be used in an oscilloscope, a fractional-N phase locked loop (PLL), a time interleaved analog-to-digital converter (ADC), or the like. A DTC included in the fractional-N PLL circuit may delay in advance, a reference clock signal, by as much as a delay amount corresponding to a quantization error and provide the delayed reference clock signal as an input clock of a phase locked loop, and thus a quantization error of the fractional-N PLL circuit may be removed in advance. For the effective operation of the DTC, it is desirable to quickly derive a gain value of the DTC that satisfies operation conditions of a clock signal generator including the DTC.

SUMMARY

The inventive concepts provide phase locked loop circuits capable of decreasing the time taken to derive a gain value used to operate a digital-to-time converter (DTC), clock signal generators, and methods of operating the phase locked loop circuits and the clock signal generators.

According to some example embodiments, there is provided a clock signal generator configured to generate a target output clock signal based on a reference clock signal. The clock signal generator includes a digital-to-time converter (DTC) configured to delay a reference clock signal based on an input code to generate a delay clock signal, and output the delay clock signal. The clock signal generator further includes a DTC controller configured to determine an initial gain value of the DTC based on a result of comparing at least one delay amount of the DTC with a period of a previously generated output clock signal, and generate the input code based on the initial gain value. The clock signal generator further includes a phase locked loop configured to generate the target output clock signal based on the delay clock signal and a division clock signal of the previously generated output clock signal, the target output clock signal being locked to the delay clock signal.

According to some example embodiments, there is provided a phase locked loop circuit including a phase locked loop configured to generate a target output clock signal based on a division clock signal of a previously generated output clock signal and an input clock signal, the target output clock signal being locked to the input clock signal; a modulator configured to change a division ratio of the phase locked loop, and output an error value occurring according to the changed division ratio; a digital-to-time converter (DTC) configured to delay a reference clock signal based on an input code to generate the input clock signal, and provide the input clock signal to the phase locked loop; and a DTC controller configured to determine an initial gain value of the DTC based on a result of comparing at least one delay amount of the DTC with a period of a previously generated output clock signal, and generate the input code based on the initial gain value.

According to some example embodiments, there is provided a method of operating a phase locked loop circuit including a digital-to-time converter (DTC) configured to provide an input clock signal that delays a reference clock signal. The method includes generating a target output clock signal having a target frequency by locking a frequency of a division clock signal of a previously generated output clock signal to a frequency of the input clock signal. The method further includes determining an initial gain value of the DTC based on a result of comparing at least one temporal difference between the reference clock signal and at least one previously generated input clock signal with a period of the previously generated output clock signal. Furthermore, the method includes locking a phase of the target output clock signal to a phase of the reference clock signal by calibrating a delay amount of the DTC based on the initial gain value.

According to some example embodiments, there is provided a wireless communication device including: a signal processor configured to process a transmission signal and a receiving signal in a base band, and output a frequency control signal; a transceiver configured to time-serially perform a transmission operation and a receiving operation; and a clock signal generator configured to generate an target output clock signal used to provide a frequency for sampling the transmission signal and the receiving signal in response to the frequency control signal, wherein the clock signal generator comprises: a phase locked loop configured to generate the target output clock signal based on a division clock signal of a previously generated output clock signal and an input clock signal the target output clock signal being locked to the input clock signal, and change a division ratio used to generate the division clock signal based on the frequency control signal, a digital-to-time converter (DTC) configured to delay a reference clock signal based on an input code to generate the input clock signal, and provide the input clock signal to the phase locked loop; and a DTC controller configured to determine an initial gain value of the DTC based on a result of comparing at least one delay amount of the DTC with a period the previously generated output clock signal, and generate the input code based on the initial gain value.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION

Hereinafter, some example embodiments of the inventive concepts will be described with reference to the attached drawings.

Figure 1:
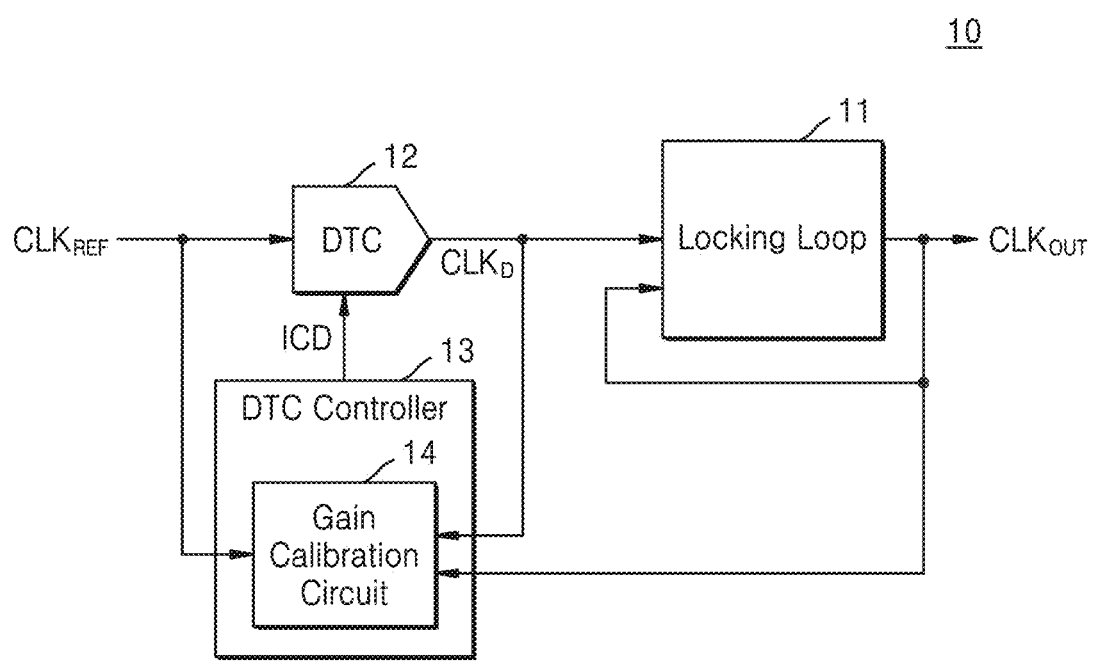
FIG. 1 is a block diagram of a clock signal generator according to some example embodiments.

FIG. 1 is a block diagram of a clock signal generator 10 according to some example embodiments. The clock signal generator 10 may be included in a receiving and/or transmitting circuit of a wireless communication device, a system on chip (SoC), an interface circuit for receiving and/or transmitting signals from/to devices (e.g., wireless communication devices), or the like.

Referring to FIG. 1, the clock signal generator 10 may generate an output clock signal $CLK_{OUT}$ based on a received reference clock signal $CLK_{REF}$ and may include a locking loop 11, a digital-to-time converter 12 (hereinafter, referred to as the DTC), and a DTC controller 13. The reference clock signal $CLK_{REF}$ may be provided from a reference clock signal generator (e.g., an oscillator, a periodic signal generator, etc.) included in the device (or a circuit) on which the clock signal generator 10 is included, or from outside the device. In some example embodiments, a frequency of the output clock signal $CLK_{OUT}$ may be N times (where, N is a real number equal to or greater than 1) a frequency of the reference clock signal $CLK_{REF}$. Any or all of the locking loop 11, the DTC 12, and the DTC controller 13 may be embodied, for example, by circuits or circuitry or, alternatively, at least one processor executing program code including instructions corresponding to any or all operations described herein as being performed by the locking loop 11, the DTC 12, and the DTC controller 13. The instructions may be stored in a memory. The term 'processor,' as used in the present disclosure, may refer to, for example, a hardware-implemented data processing device having circuitry that is physically structured to execute desired operations including, for example, operations represented as code and/ or instructions included in a program. In at least some example embodiments the above-referenced hardware-implemented data processing device may include, but is not limited to, a microprocessor, a central processing unit (CPU), a processor core, a multi-core processor; a multi-processor, an application-specific integrated circuit (ASIC), and a field programmable gate array (FPGA).

The DTC 12 may generate a delay clock signal $CLK_D$ that delays the received reference clock signal $CLK_{REF}$ by as much as a period of time corresponding to an input of the DTC 12, that is, an input code ICD. In other words, the DTC 12 may generate a delay clock signal $CLK_D$ having a delay amount (e.g., a delay time or a phase offset) that corresponds to the input code ICD. The DTC 12 may generate delay amounts in various manners. For example, the DTC 12 may generate delay times by selecting a number of delay cells corresponding to the input codes ICD among delay cells included in the DTC 12. Also, the DTC 12 may generate delay amounts using a passive element is charged or discharged based on a current corresponding to the input code ICD. However, one or more example embodiments are not limited thereto. The DTC 12 may operate in various manners.

The locking loop 11 may receive the delay clock signal $CLK_D$ provided from the DTC 12 as an input clock signal and may generate an output clock signal $CLK_{OUT}$ synchronized with the delay clock signal $CLK_D$, based on the delay clock signal $CLK_D$. The locking loop 11 may provide feedback about the output clock signal $CLK_{OUT}$ or a division clock signal that divides the output clock signal $CLK_{OUT}$, and may generate the output clock signal $CLK_{OUT}$, for example, an output clock signal $CLK_{OUT}$ having the same phase as the delay clock signal $CLK_D$, based on the delay clock signal $CLK_D$ and a feedback signal. In some example embodiments, the locking loop 11 may include a phase locked loop PLL, a delay locked loop DLL, a phase/frequency locked loop, and the like. However, one or more example embodiments are not limited thereto. The locking loop 11 may be embodied as at least one of various locking loops.

The DTC controller 13 may control the delay amount of the DTC 12 by providing the input code ICD to the DTC 12. The DTC controller 13 may calibrate the input code ICD and may change the delay amount. The DTC controller 13 may derive a gain value used to drive the DTC 12 and may calibrate the input code ICD based on the derived gain value. In this case, the gain value may change according to a frequency of the output clock signal $CLK_{OUT}$.

The DTC controller 13 may include a gain calibration circuit 14 for quickly obtaining an initial value (hereinafter, referred to as an initial gain value) of the gain value used to drive the DTC 12. The DTC controller 13 may be embodied, for example, by circuits or circuitry or, alternatively, at least one processor executing program code including instructions corresponding to any or all operations described herein as being performed by the DTC controller 13.

The gain calibration circuit 14 may quickly obtain the initial gain value based on a temporal difference between the reference clock signal $CLK_{REF}$ and the delay clock signal $CLK_D$, that is, a delay amount of the DTC 12 and one cycle of the output clock signal $CLK_{OUT}$ (also referred to herein as the "period" of the output clock signal $CLK_{OUT}$). The gain calibration circuit 14 may compare the delay amount of the DTC 12 with one cycle of the output clock signal $CLK_{OUT}$ and may perform a binary search operation based on a comparison result, thereby quickly deriving the initial gain value. In some example embodiments, the gain calibration circuit 14 may use a time-to-digital converter to convert the delay amount of the DTC 12 and one cycle of the output clock signal $CLK_{OUT}$ into digital code values and may compare the digital code values with each other, thereby outputting comparison results.

It is desirable that the initial gain value used to drive the DTC 12 be quickly derived to decrease a locking time taken for the clock signal generator 10 to generate an output clock signal $CLK_{OUT}$ having a target frequency and a target phase, for example, an output clock signal $CLK_{OUT}$ in a lock state. As described above, the clock signal generator 10 according to some example embodiments may quickly derive the initial gain value as the gain calibration circuit 14 performs a binary search operation based on the result of comparing the delay amount of the DTC 12 with one cycle of the output clock signal $CLK_{OUT}$. Accordingly, the locking time of the clock signal generator 10 according to some example embodiments may decrease in comparison to conventional clock signal generators.

FIG. 1 shows that the DTC controller 13 operates based on the reference clock signal $CLK_{REF}$, the delay clock signal $CLK_D$, and the output clock signal $CLK_{OUT}$. However, the illustration of FIG. 1 is an example for convenience of explanation, and thus one or more example embodiments are not limited thereto. As described below, the DTC controller 13 may operate in response to various signals.

Figure 2:
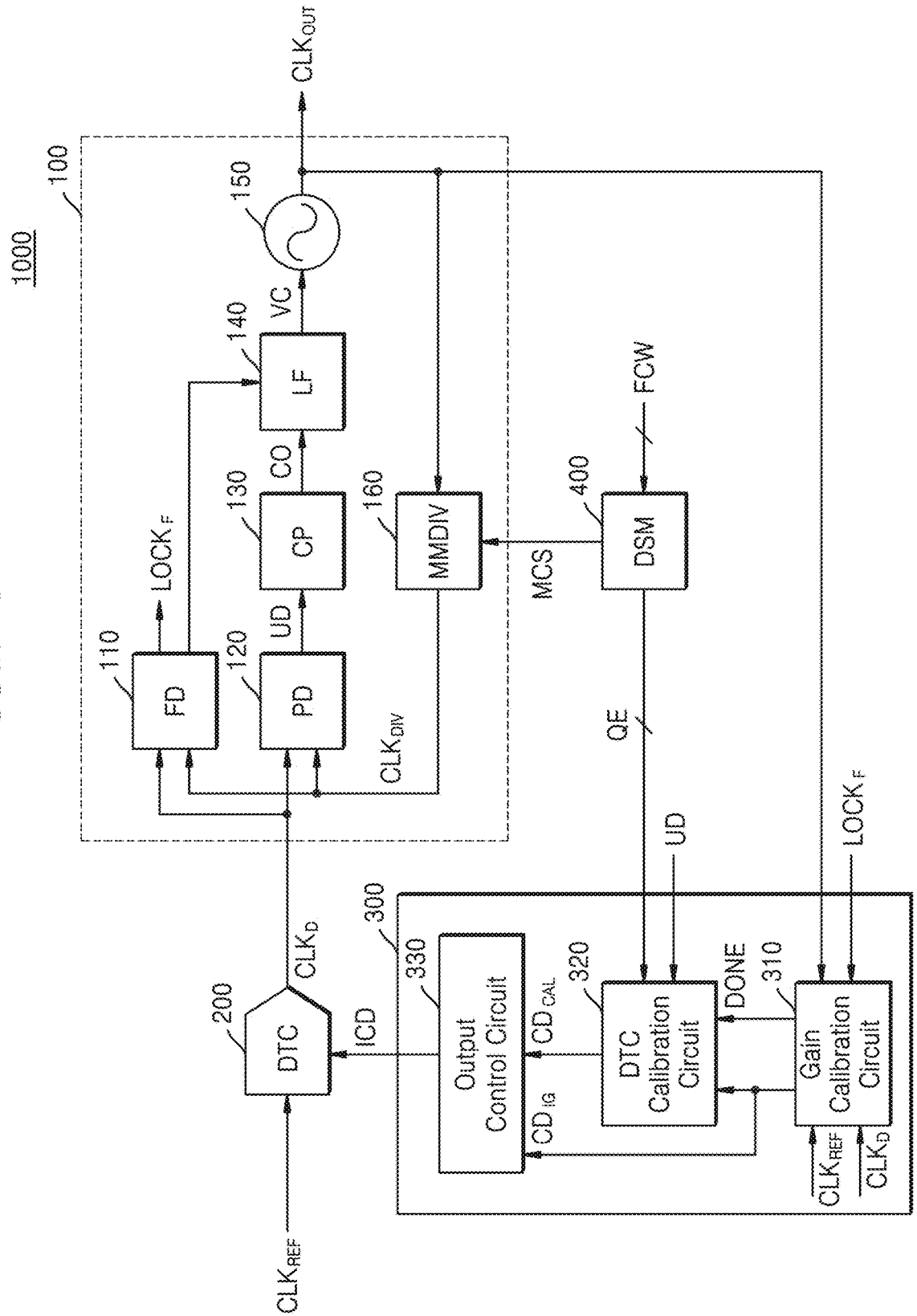
FIG. 2 is a block diagram of a phase locked loop circuit according to some example embodiments.

FIG. 2 is a block diagram of a phase locked loop circuit 1000 according to some example embodiments.

The phase locked loop circuit 1000 may be included in a transmitting and/or receiving circuit of a wireless communication device, an SoC, an interface circuit in which signals are exchanged between devices (e.g., wireless communication devices, base stations, etc.), and the like. The phase locked loop circuit 1000 may be included in different devices operating in response to clock signals and may provide clock signals.

Referring to FIG. 2, the phase locked loop circuit 1000 may include a phase locked loop 100, a DTC 200, a DTC controller 300, and a modulator (DSM) 400. The phase locked loop 100 may be a fractional-N phase locked loop, and the phase locked loop circuit 1000 may generate an output clock signal $CLK_{OUT}$ having a frequency N times (where, N is a real number equal to or greater than 1) a frequency of a received reference clock signal $CLK_{REF}$.

The DTC 200 may generate the delay clock signal $CLK_D$ that delays the received reference clock signal $CLK_{REF}$ by as much as a period of time corresponding to the input code ICD. Since the DTC 200 is similar to or the same as the DTC 12 of FIG. 1, detailed descriptions thereof will be omitted. The DTC 200 may be embodied, for example, by circuits or circuitry or, alternatively, at least one processor executing program code including instructions corresponding to any or all operations described herein as being performed by the DTC 200.

The phase locked loop 100 may include a frequency detector 110, a phase detector 120, a charge pump 130, a loop filter 140, an oscillator 150, and a multi-modulus divider 160. In some example embodiments, the frequency detector 110 and the phase detector 120 may be integrally formed. Any or all of the frequency detector 110, the phase detector 120, the charge pump 130, the loop filter 140, the oscillator 150, and the multi-modulus divider 160 may be embodied, for example, by circuits or circuitry or, alternatively, at least one processor executing program code including instructions corresponding to any or all operations described herein as being performed by the phase locked loop 100, the frequency detector 110, the phase detector 120, the charge pump 130, the loop filter 140, the oscillator 150, and the multi-modulus divider 160.

The frequency detector 110 may detect (e.g., determine) a frequency difference between a division clock signal $CLK_{DIV}$, which is generated as the output clock signal $CLK_{OUT}$ is divided, and the delay clock signal $CLK_D$. The frequency detector 110 may generate a frequency lock signal $LOCK_F$ when frequencies of the division clock signal $CLK_{DIV}$ and the delay clock signal $CLK_D$ are identical or similar to each other. For example, when the frequencies of the division clock signal $CLK_{DIV}$ and the delay clock signal $CLK_D$ are different from each other, the frequency detector 110 may generate a frequency lock signal $LOCK_F$ having logic low (that is, an inactive level), and when the frequencies of the division clock signal $CLK_{DIV}$ and the delay clock signal $CLK_D$ are identical or similar to each other, the frequency detector 110 may generate a frequency lock signal $LOCK_F$ that is logic high (that is, an active level). In some example embodiments, the frequency detector 110 may generate a control signal (e.g., a current signal) used to control the loop filter 140, based on the frequency difference between the division clock signal $CLK_{DIV}$ and the delay clock signal $CLK_D$.

The phase detector 120 may detect (e.g., determine) the phase difference between the delay clock signal $CLK_D$ and the division clock signal $CLK_{DIV}$, and may generate a phase difference signal UD corresponding to the phase difference. In some example embodiments, the phase detector 120 may generate, as the phase difference signal UD, a sampling voltage generated by sampling the delay clock signal $CLK_D$ and the phase difference of the delay clock signal $CLK_D$, based on certain clock signals.

The charge pump 130 may generate a pump output current, that is, a control current CO, which corresponds to the phase difference signal UD. The loop filter 140 may generate an oscillation control voltage VC by integrating the control current CO, and the oscillator 150 may generate an output clock signal $CLK_{OUT}$ that has a certain target frequency and oscillates in response to the oscillation control voltage VC.

The multi-modulus divider 160 may generate the division clock signal $CLK_{DIV}$ by dividing the output clock signal $CLK_{OUT}$ based on a set division ratio. An average division ratio of the phase locked loop 100 during a certain period of time may be expressed as a fraction instead of an integer. The multi-modulus divider 160 may divide the output clock signal $CLK_{OUT}$ at an integer division ratio and may change the integer division ratio, thereby satisfying a fractional division ratio. The multi-modulus divider 160 may divide the output clock signal $CLK_{OUT}$ in each feedback loop, based on an integer division ratio that is set according to a control signal MCS provided from the modulator 400.

The modulator 400 may receive a frequency control command FCW and may generate the control signal MCS regarding the multi-modulus divider 160 according to the frequency control command FCW. The frequency control command FCW may be provided from a controller included in a device on which the phase locked loop 100 is included or in a circuit that operates based on the output clock signal $CLK_{OUT}$. The frequency control command FCW may be set based on the reference clock signal $CLK_{REF}$ and the output clock signal $CLK_{OUT}$. For example, the frequency control command FCW may include a decimal part of an average division ratio set for the phase locked loop 100. The modulator 400 may be embodied as a delta-sigma modulator. The modulator 400 may be embodied, for example, by circuits or circuitry or, alternatively, at least one processor executing program code including instructions corresponding to any or all operations described herein as being performed by the modulator 400.

The modulator 400 may provide the integer division ratio to the multi-modulus divider 160. For example, when the multi-modulus divider 160 is set to divide the output clock signal $CLK_{OUT}$ based on one division ratio from among K−1, K, and K+1 (where, K is a positive integer), the modulator 400 may select one of the integer division ratios, that is, K−1, K, and K+1, in each loop in such a manner that the average division ratio has a desired value (e.g., a target value), and may provide the multi-modulus divider 160 with the selected integer division ratio (or a coefficient indicating the selected integer division ratio) as the control signal MCS.

For example, assuming that the multi-modulus divider 160 is set to divide the output clock signal $CLK_{OUT}$ based on one division ratio from among K and K+1, a default division ratio, that is, K, is 2, and an average division ratio is 2.25, the modulator 400 may receive 0.25 that is a decimal part as the frequency control command FCW. The modulator 400 may divide the output clock signal $CLK_{OUT}$ by 2 three out of four times on average and by 3 one out of four times on average so that the average division ratio becomes 2.25 based on the set integer division ratios 2 and 3, respectively. Thus, the modulator 400 may output, to the multi-modulus divider 160, the control signal MCS indicating a value added to the default division ratio. For example, the control signal MCS may be either '0' or '1'. In this case, '0' or '1' may be randomly selected, '0' may be selected 3 out of 4 times on average, and '1' may be selected 1 out of 4 times on average. The multi-modulus divider 160 may change the division ratio based on the received control signal MCS.

As described above, as the integer division ratio is changed, a quantization error (QE) may occur. In the phase locked loop 100, the QE may occur due to a difference between the integer division ratio, which is a real-time division ratio, and a fractional-N division ratio that is the average division ratio. Therefore, the modulator 400 may provide the QE (e.g., a QE value representing the QE) to the DTC controller 300, and the DTC controller 300 may calibrate (e.g., generate) the input code ICD in such a manner that the delay amount of the DTC 200 corresponds to the QE.

The DTC controller 300 may include the gain calibration circuit 310 and the DTC calibration circuit 320 and may further include the output control circuit 330.

When the phase locked loop 100 is in a frequency lock state, in other words, when the phase locked loop 100 outputs a frequency lock signal $LOCK_F$ that is logic high, the gain calibration circuit 310 may derive the initial gain value $CD_{IG}$ of the DTC 200 in response to the frequency lock signal $LOCK_F$.

When the target frequency of the output clock signal $CLK_{OUT}$ is changed due to the frequency control signal FCW, the phase locked loop circuit 1000 may perform coarse locking, and accordingly, the frequency of the output clock signal $CLK_{OUT}$ may reach the target frequency. When the frequency of the output clock signal $CLK_{OUT}$ reaches the target frequency, the gain calibration circuit 310 may be driven in response to the frequency lock signal $LOCK_F$ that is logic high.

The gain calibration circuit 310 may obtain the delay amount of the DTC 200 based on the reference clock signal $CLK_{REF}$ and the delay clock signal $CLK_D$ and may derive the initial gain value $CD_{IG}$ according to a binary search algorithm, based on the result of comparing the delay amount with one cycle of the output clock signal $CLK_{OUT}$.

The gain calibration circuit 310 may provide the DTC 200 with, as the input code ICD via the output control circuit 330, a set initial gain value $CD_{IG}$ and/or the initial gain value $CD_{IG}$ that is calibrated according to the binary search operation. As the initial gain value $CD_{IG}$ is calibrated, the delay amount of the DTC 200 may be changed. The gain calibration circuit 310 may derive a target initial gain value $CD_{IG}$ based on the delay amount that is changed according to the binary search operation.

When the output clock signal $CLK_{OUT}$ has the target frequency, a delay amount $D_{DTC}$ that the DTC 200 should delay may be expressed via Equation 1 to lock the phase of the output clock signal $CLK_{OUT}$ to a phase of the delay clock signal $CLK_D$.

$$D_{DTC}=T_{OUT}*QE=K_D*G_{DTC}*QE \qquad \text{[Equation 1]}$$

wherein, $T_{OUT}$ indicates one cycle of the output clock signal $CLK_{OUT}$ having a target frequency, $K_D$ indicates a period of time that may be delayed for one digital code as a unit resolution (or a unit delay amount) of the DTC 200, and $G_{DTC}$ indicates a gain value of the DTC 200.

As calculated according to Equation 2, the gain value $G_{DTC}$ of the DTC 200 corresponds to a value obtained by dividing one cycle $T_{OUT}$ of the output clock signal $CLK_{OUT}$ by the unit resolution $K_D$, and the delay amount $D_{DTC}$ may be generated based on the gain value $G_{DTC}$ of the DTC 200 according to Equation 1.

$$G_{DTC}=T_{OUT}/K_D \qquad \text{[Equation 2]}$$

According to Equation 2, the gain value $G_{DTC}$ denotes a code value that may delay the reference clock signal $CLK_{REF}$ by as much as a period of time corresponding to one cycle $T_{OUT}$ of the output clock signal $CLK_{OUT}$.

The gain calibration circuit 310 may compare the delay amount of the DTC 200 with one cycle $T_{OUT}$ of the output clock signal $CLK_{OUT}$ and may calibrate the initial gain value $CD_{IG}$ by performing the binary search operation based on the comparison result, thereby deriving the code value that is, the initial gain value $CD_{IG}$, which delays the reference clock signal $CLK_{REF}$ by as much as the period of time corresponding to one cycle $T_{OUT}$ of the output clock signal $CLK_{OUT}$. The binary search operation may be performed during a period of time corresponding to M cycles (where, M is the number of bits of the input code ICD) of the reference clock signal $CLK_{REF}$. When the binary search operation has been completed, the gain calibration circuit 310 may output a completion signal DONE (e.g., an operation completion signal) indicating that the binary search operation has been completed (e.g., indicating that the initial gain value $CD_{IG}$ is a target value).

When the completion signal DONE is output from the gain calibration circuit 310, the DTC calibration circuit 320 may generate a control code value $CD_{CAL}$ based on the initial gain value $CD_{IG}$ provided along with the completion signal DONE. The DTC calibration circuit 320 may receive the phase difference signal UD from the phase locked loop 100, may generate the control code value $CD_{CAL}$ based on the initial gain value $CD_{IG}$, the phase difference signal UD, and the QE by receiving the QE from the modulator 400, and thus may lock the phase of the output clock signal $CLK_{OUT}$ in the reference clock signal $CLK_{REF}$. In other words, the DTC calibration circuit 320 may perform a background fine locking operation. The DTC calibration circuit 320 may generate the gain value $G_{DTC}$ by accumulating correlation values of codes of the phase difference signal UD and the QE to the initial gain value $CD_{IG}$ and may generate the control code value $CD_{CAL}$ by multiplying the gain value $G_{DTC}$ by the QE. A detailed structure and a detailed operation of the DTC calibration circuit 320 will be described below with reference to FIG. 6.

As described above, the DTC calibration circuit 320 may generate the gain value $G_{DTC}$ by accumulating the correlation values of the codes of the phase difference signal UD and the QE to the initial gain value $CD_{IG}$, and when the initial gain value $CD_{IG}$ is set to be '0', there may be excessive delay for the gain value $G_{DTC}$ to reach a target gain value. For example, when assuming that one cycle of the output clock signal $CLK_{OUT}$ is 500 picoseconds (ps) and the unit resolution $K_D$ is 1 ps, the target gain value may be 500. When the initial gain value $CD_{IG}$ is set to be '0', it may take periods of time that correspond to hundreds of cycles of the reference clock signal $CLK_{REF}$ to make the gain value $G_{DTC}$ reach '500'. Also, a state in which the frequency of the output clock signal $CLK_{OUT}$ reaches the target frequency, that is, the frequency lock state, is achieved before calculating the gain value $G_{DTC}$. Thus, there may be excessive delay for the output clock signal $CLK_{OUT}$ to reach a phase lock state. In addition, since the gain value $G_{DTC}$ of the DTC 200 may be changed according to the frequency of the output clock signal $CLK_{OUT}$, the derivation of the gain value $G_{DTC}$ of the DTC 200 is repeated when the target frequency is changed.

However, in the DTC controller 300 according to some example embodiments, the gain calibration circuit 310 may derive the initial gain value $CD_{IG}$ that may delay the reference clock signal $CLK_{REF}$ by as much as a period of time corresponding to one cycle $T_{OUT}$ of the output clock signal $CLK_{OUT}$ within a relatively short period of time based on the binary search algorithm, and the DTC calibration circuit 320 may perform fine locking based on the initial gain value $CD_{IG}$. Therefore, the locking time of the phase locked loop circuit 1000 may decrease.

The DTC controller 300 may further include the output control circuit 330. The output control circuit 330 may select one of the initial gain value $CD_{IG}$ output from the gain calibration circuit 310 and the control code value $CD_{CAL}$ output from the DTC calibration circuit 320 and may provide the selected value as the input code ICD of the DTC 200. When the gain calibration circuit 310 performs the binary search operation, the output control circuit 330 may provide the initial gain value $CD_{IG}$ output from the gain calibration circuit 310 as the input code ICD of the DTC 200. When the completion signal DONE is output as the binary search operation has been completed, the output control circuit 330 may provide the control code value $CD_{CAL}$ output from the DTC calibration circuit 320 as the input code ICD of the DTC 200. The gain calibration circuit 310 is discussed further below in association with FIG. 3, the DTC calibration circuit 320 is discussed further below in association with FIG. 6, and the output control circuit 330 is discussed further below in association with FIG. 7.

Figure 3:
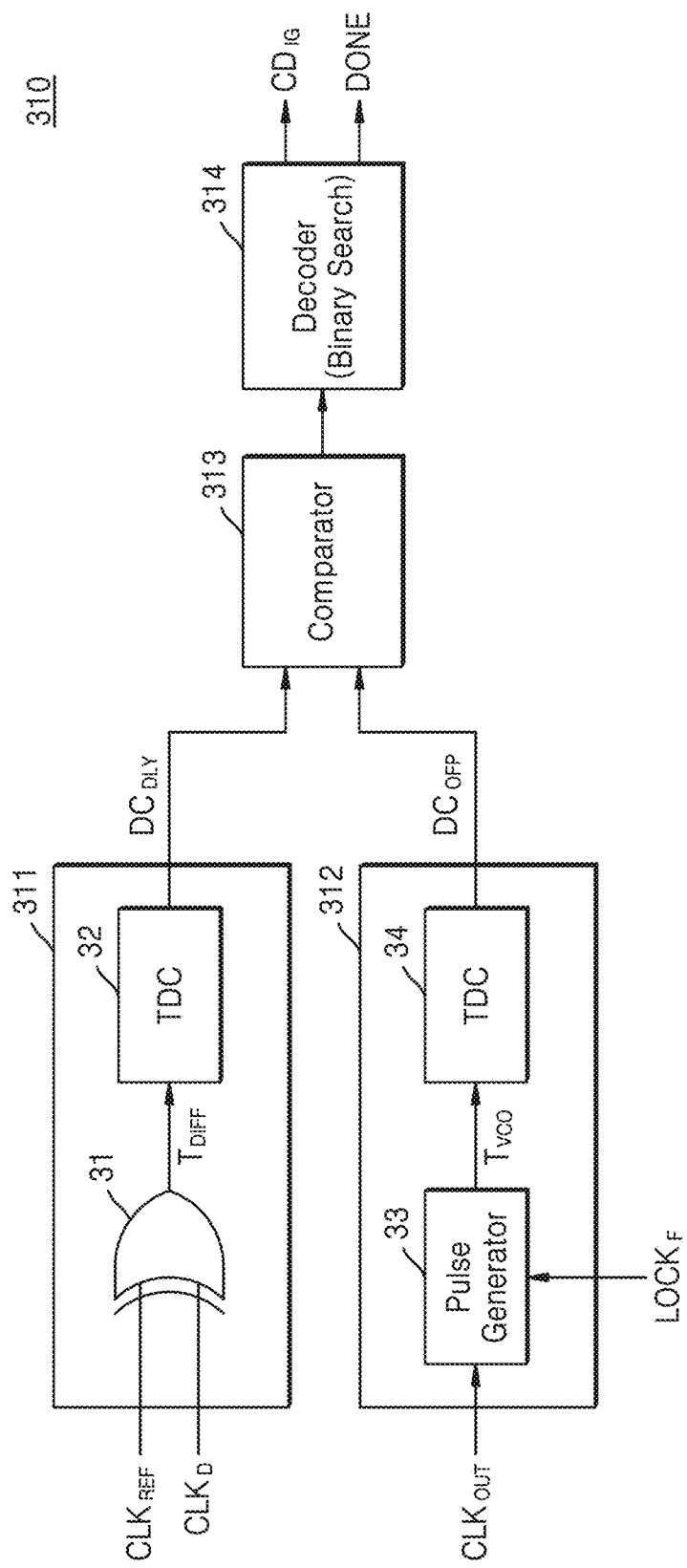
FIG. 3 is a block diagram of an example of a gain calibration circuit, according to some example embodiments.
Figure 4A:
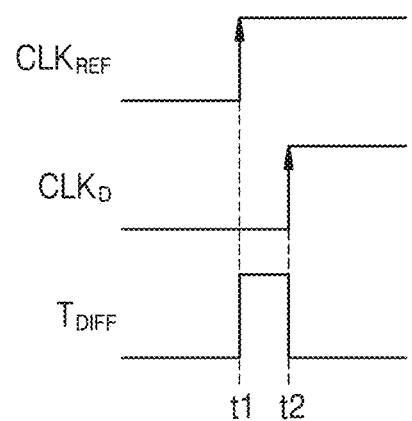
FIGS. 4A and 4B are timing diagrams of operations of a logic circuit and a pulse generator of FIG. 3.
Figure 4B:
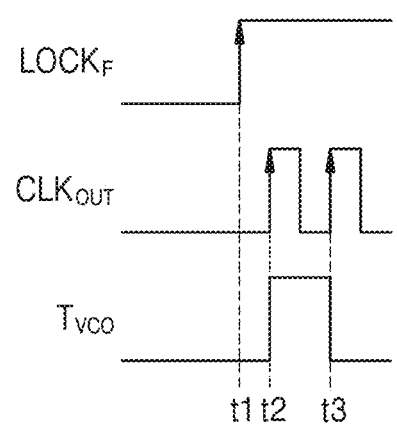

FIG. 3 is a block diagram of an example of the gain calibration circuit 310, according to some example embodiments. FIGS. 4A and 4B are timing diagrams of operations of a logic circuit 31 and a pulse generator 33 of FIG. 3.

The gain calibration circuit 310 of FIG. 3 may function as the gain calibration circuit 310 of FIG. 2, and the descriptions of the gain calibration circuit 310 provided with reference to FIG. 2 may be applied to the gain calibration circuit 310 provided with reference to FIG. 3.

Referring to FIG. 3, the gain calibration circuit 310 may include a first time-to-digital conversion circuit 311, a second time-to-digital conversion circuit 312, a comparator 313, and a decoder 314. The first time-to-digital conversion circuit 311 and the second time-to-digital conversion circuit 312 may include time-to-digital converters 32 and 34, respectively.

The first time-to-digital conversion circuit 311 may include the logic circuit 31, which extracts a temporal difference (or a phase difference) between the reference clock signal $CLK_{REF}$ and the delay clock signal $CLK_D$, and the first time-to-digital converter 32. FIG. 3 illustrates that the logic circuit 31 is embodied as an exclusive OR logic gate. However, one or more example embodiments are not limited thereto.

The logic circuit 31 may receive the reference clock signal $CLK_{REF}$ and the delay clock signal $CLK_D$ and may generate a temporal difference signal $T_{DIFF}$ indicating the temporal difference between the reference clock signal $CLK_{REF}$ and the delay clock signal $CLK_D$. The temporal difference signal $T_{DIFF}$ may be similar or identical to the delay amount of the DTC (e.g., DTC 200 of FIG. 2).

Referring to FIG. 4A, the logic circuit 31 may generate the temporal difference signal $T_{DIFF}$ indicating the temporal difference between the reference clock signal $CLK_{REF}$ and the delay clock signal $CLK_D$ in response to a rising edge (or a falling edge) of the reference clock signal $CLK_{REF}$ and a rising edge (or a falling edge) of the delay clock signal $CLK_D$ at a point in time t1. As shown in the drawing, an interval between the point in time t1, when the rising edge of the reference clock signal $CLK_{REF}$ occurs, and a point in time t2, when the rising edge of the delay clock signal $CLK_D$ occurs, may indicate the temporal difference between the reference clock signal $CLK_{REF}$ and the delay clock signal $CLK_D$.

Referring back to FIG. 3, the first time-to-digital converter 32 may generate a first digital code $DC_{DLY}$ based on the temporal difference signal $T_{DIFF}$ indicating the temporal difference between the reference clock signal $CLK_{REF}$ and the delay clock signal $CLK_D$. The first digital code $DC_{DLY}$ is a digital value corresponding to the temporal difference between the reference clock signal $CLK_{REF}$ and the delay clock signal $CLK_D$.

The second time-to-digital conversion circuit 312 may include the pulse generator 33 and the second time-to-digital converter 34. The pulse generator 33 may generate a pulse signal $T_{VCO}$ that indicates one cycle of the output clock signal $CLK_{OUT}$, based on the output clock signal $CLK_{OUT}$ when the frequency lock signal $LOCK_F$ becomes logic high.

Referring to FIG. 4B, when the frequency lock signal $LOCK_F$ becomes logic high at the point in time t1, the pulse generator 33 may generate the pulse signal $T_{VCO}$, based on the rising edge (or the falling edge) of the output clock signal $CLK_{OUT}$. Accordingly, the pulse signal $T_{VCO}$ may be generated at an interval between the point in time t2 and a point in time t3, and the rising edge of the output clock signal $CLK_{OUT}$ occurs at the interval.

Referring back to FIG. 3, the second time-to-digital converter 34 may generate a second digital code $DC_{OFP}$ in response to the pulse signal $T_{VCO}$. The second digital code $DC_{OFP}$ is a digital value corresponding to one cycle of the output clock signal $CLK_{OUT}$.

The comparator 313 may output a comparison result by comparing the first digital code $DC_{DLY}$ to the second digital code $DC_{OFP}$. For example, when the first digital code $DC_{DLY}$ is greater than the second digital code $DC_{OFP}$, the comparator 313 may output data '1', and when the first digital code $DC_{DLY}$ is less than the second digital code $DC_{OFP}$, the comparator 313 may output data '0'. In some example embodiments, when the first digital code $DC_{DLY}$ is the same as the second digital code $DC_{OFP}$, the comparator 313 may provide the decoder 314 with a separate signal indicating that the first digital code $DC_{DLY}$ is the same as the second digital code $DC_{OFP}$.

The decoder 314 may perform the binary search operation by implementing the binary search algorithm based on the comparison result and may calibrate the initial gain value $CD_{IG}$. The binary search operation of the decoder 314 will be described with reference to FIG. 5. Any or all of the comparator 313, the decoder 314, the first time-to-digital converter 32, the second time-to-digital converter 34, the logic circuit 31, and the pulse generator 33 may be embodied, for example, by circuits or circuitry or, alternatively, at least one processor executing program code including instructions corresponding to any or all operations described herein as being performed by the gain calibration circuit 310, the first time-to-digital conversion circuit 311, the second time-to-digital conversion circuit 312, the comparator 313, the decoder 314, the first time-to-digital converter 32, the second time-to-digital converter 34, the logic circuit 31, and the pulse generator 33.

Figure 5:
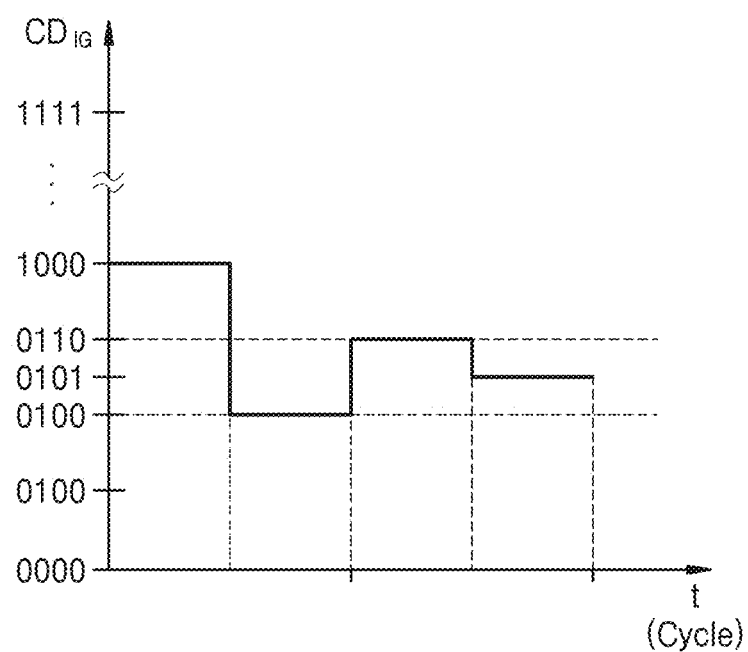
FIG. 5 shows an example of a binary search operation.

FIG. 5 shows an example of the binary search operation. A horizontal axis indicates time, and a vertical axis indicates the initial gain value $CD_{IG}$.

The example of FIG. 5 is based on the assumption that the input code ICD of the DTC 200 of FIG. 2 is 4 bits and the initial gain value $CD_{IG}$ is '1000' that is a median of the input code ICD.

A default value of the initial gain value $CD_{IG}$ may be set to be '1000' that is the median of the input code ICD. The default value of the initial gain value $CD_{IG}$ may be provided to the DTC 200 as the input code ICD, and the DTC 200 may generate the delay clock signal $CLK_D$ that delays the reference clock signal $CLK_{REF}$ by as much as a period of time corresponding to '1000'.

The comparator 313 of FIG. 3 may compare the first digital code $DC_{DLY}$ indicating the temporal difference between the reference clock signal $CLK_{REF}$ and the delay clock signal $CLK_D$ with the second digital code $DC_{OFP}$ indicating one cycle of the output clock signal $CLK_{OUT}$ and may provide a comparison result to the decoder 314. When the first digital code $DC_{DLY}$ is greater than the second digital code $DC_{OFP}$, that is, when the temporal difference between the reference clock signal $CLK_{REF}$ and the delay clock signal $CLK_D$, that is, the delay amount of the DTC 200 that corresponds to the input code ICD '1000', is greater than one cycle of the output clock signal $CLK_{OUT}$, the decoder 314 may calibrate (e.g., change and/or determine) the initial gain value $CD_{IG}$ to '0100' according to the binary search algorithm. The calibrated initial gain value $CD_{IG}$, that is, '0100', is provided to the DTC 200 as the input code ICD, and the DTC 200 may generate the delay clock signal $CLK_D$ that delays the reference clock signal $CLK_{REF}$ by as much as a period of time corresponding to '0100'. When the delay amount of the DTC 200 that corresponds to '0100' that is the input code ICD is less than one cycle of the output clock signal $CLK_{OUT}$, the decoder 314 may calibrate (e.g., change) the initial gain value $CD_{IG}$ to '0110' according to the binary search algorithm.

The calibrated initial gain value $CD_{IG}$, that is, '0110', is provided to the DTC 200 as the input code ICD, and the DTC 200 may generate the delay clock signal $CLK_D$ that delays the reference clock signal $CLK_{REF}$ by as much as a period of time corresponding to '0110'. When the delay amount of the DTC 200 that corresponds to '0110' that is the input code ICD is greater than one cycle of the output clock signal $CLK_{OUT}$, the decoder 314 may calibrate (e.g., change) the initial gain value $CD_{IG}$ to '0101' according to the binary search algorithm. Therefore, the initial gain value $CD_{IG}$ '0101' may be derived. As described, the decoder 314 may perform the binary search algorithm until a last bit of the initial gain value $CD_{IG}$ is changed.

Accordingly, one cycle of the output clock signal $CLK_{OUT}$ may be between a delay amount corresponding to '0110' that is the initial gain value $CD_{IG}$ and a delay amount corresponding to '0100', and thus, '0101' that is the initial gain value $CD_{IG}$ may be derived.

The calibration of the initial gain value $CD_{IG}$ according to the binary search algorithm, that is, the operation of the gain calibration circuit 310 of FIG. 3, may be performed during a period of time corresponding to a value obtained by multiplying one cycle of the reference clock signal $CLK_{REF}$ by the number of bits of the input code ICD. For example, as shown in FIG. 5, when the number of bits of the input code ICD is equal to 4, the calibration of the initial gain value $CD_{IG}$ may be performed for a period of time corresponding to four cycles of the reference clock signal $CLK_{REF}$.

Figure 6:
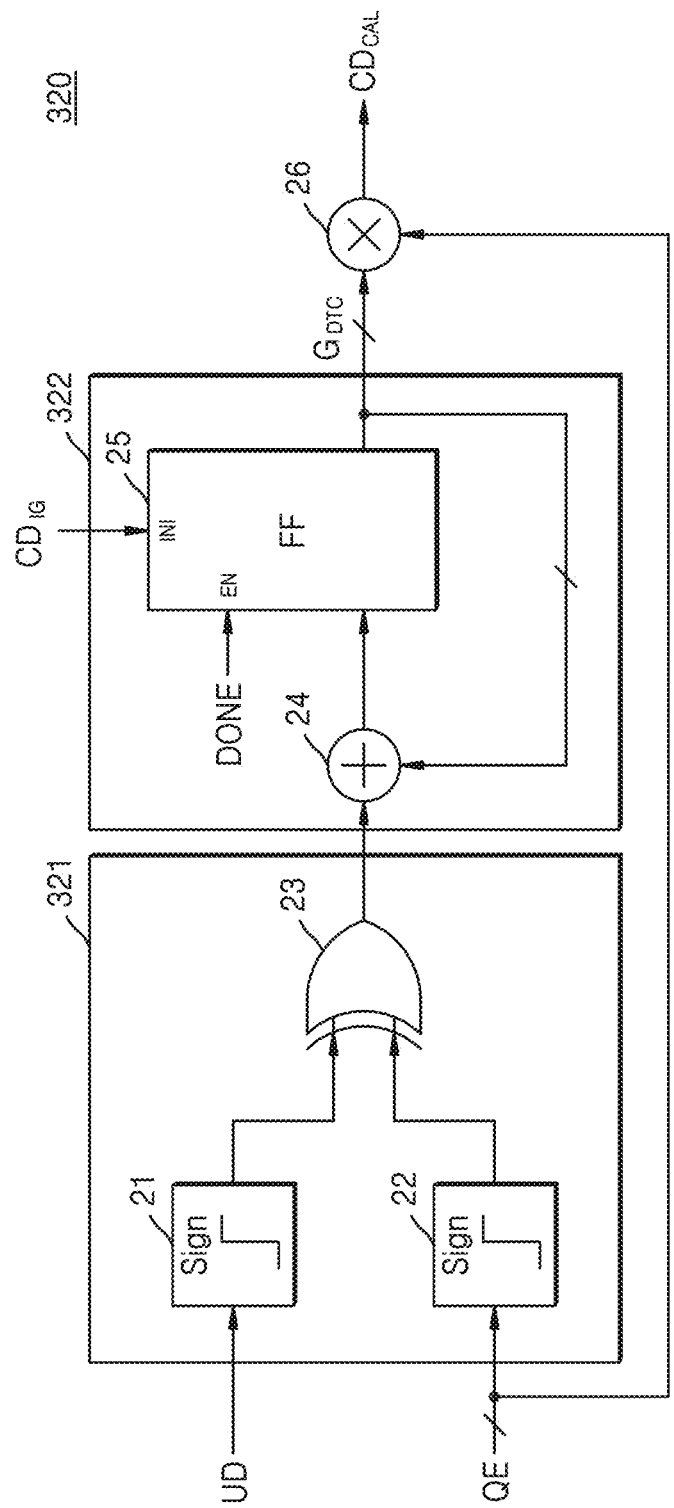
FIG. 6 is a block diagram of an example of a DTC calibration circuit, according to some example embodiments.

FIG. 6 is a block diagram of an example of the DTC calibration circuit 320, according to some example embodiments. The DTC calibration circuit 320 of FIG. 6 may be used as the DTC calibration circuit 320 of FIG. 2, and the descriptions of the DTC calibration circuit 320 that are provided with reference to FIG. 2 may be applied to the DTC calibration circuit 320 of FIG. 6.

Referring to FIG. 6, the DTC calibration circuit 320 may include a correlation circuit 321, an integrator 322, and a multiplier 26 and denotes a calibration circuit driven in a Sign-Sign least mean square (LMS) manner. In the correlation circuit 321, a first circuit 21 may detect and output a sign of a phase difference signal UD and a second circuit 22 may detect and output a sign of a QE, and a correlator 23 may output correlation values of the sign of the phase difference signal UD and the sign of the QE. For example, the correlator 23 may be implemented as an XOR (exclusive OR) gate.

The integrator 322 may include an adder 24 that receives the correlation values and a storage device 25 (e.g., a flip-flop) that receives outputs from the adder 24. Outputs from the storage device 25 may be returned as inputs of the adder 24. The storage device 25 may be enabled in response to the completion signal DONE provided from the gain calibration circuit 310 of FIG. 2 and may receive the initial gain value $CD_{IG}$ as an initial value. The integrator 322 may generate a gain value $G_{DTC}$ (e.g., a calibrated gain value) by integrating (e.g., accumulating) the correlation values based on the initial gain value $CD_{IG}$.

The multiplier 26 may generate the control code value $CD_{CAL}$ by multiplying the gain value $G_{DTC}$ by the QE. Any or all of the first circuit 21, the second circuit 22, the correlator 23, the adder 24, the storage device 25 and the multiplier 26 may be embodied, for example, by circuits or circuitry or, alternatively, at least one processor executing program code including instructions corresponding to any or all operations described herein as being performed by the DTC calibration circuit 320, the correlation circuit 321, the integrator 322, the first circuit 21, the second circuit 22, the correlator 23, the adder 24, the storage device 25 and the multiplier 26.

Figure 7:
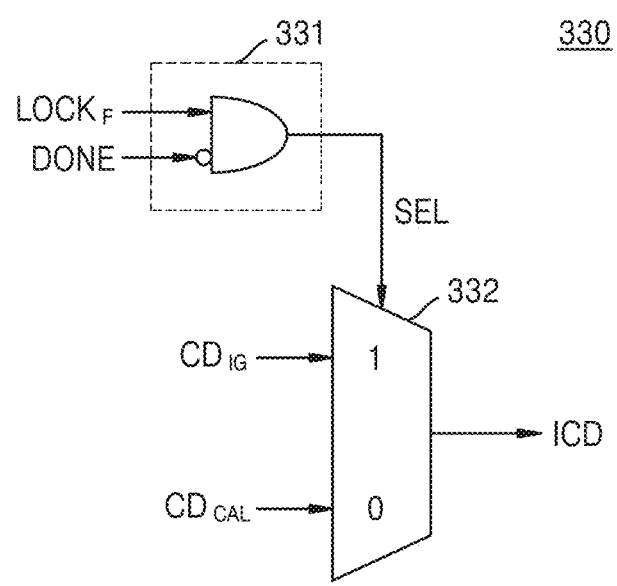
FIG. 7 is a circuit diagram of an example of an output control circuit included in a DTC controller of FIG. 2.

FIG. 7 is a circuit diagram of an example of the output control circuit 330 included in the DTC controller 300 of FIG. 2.

Referring to FIG. 7, the output control circuit 330 may include a selection signal generator 331 and a selector 332. Any or all of the selection signal generator 331 and the selector 332 may be embodied, for example, by circuits or circuitry or, alternatively, at least one processor executing program code including instructions corresponding to any or all operations described herein as being performed by the output control circuit 330, the selection signal generator 331 and the selector 332.

The selection signal generator 331 may generate a selection signal SEL based on the frequency lock signal $LOCK_F$ and the completion signal DONE provided from the gain calibration circuit 310 of FIG. 2. For example, when the frequency lock signal $LOCK_F$ is logic low or when the completion signal DONE is logic high, the selection signal SEL may be logic low, and when the frequency lock signal $LOCK_F$ is logic high and when the completion signal DONE is logic low, the selection signal SEL may be logic high.

The selector 332 may select one of the initial gain value $CD_{IG}$, which is output from the gain calibration circuit 310 of FIG. 2, and the control code value $CD_{CAL}$, which is output from the DTC calibration circuit 320, in response to the selection signal SEL, and may provide the selected value as the input code ICD of the DTC 200 of FIG. 2. For example, when the selection signal SEL is logic high, the initial gain value $CD_{IG}$ may be selected, and when the selection signal SEL is logic low, the control code value $CD_{CAL}$ may be selected. Thus, when the phase locked loop circuit 1000 of FIG. 2 performs a coarse locking operation or performs a fine locking operation based on the initial gain value $CD_{IG}$ for a frequency lock operation, the control code value $CD_{CAL}$ may be provided as the input code ICD of the DTC 200, and when the gain calibration circuit 310 calibrates the initial gain value $CD_{IG}$ by performing the binary search operation, the initial gain value $CD_{IG}$ may be provided as the input code ICD of the DTC 200.

Figure 8A:
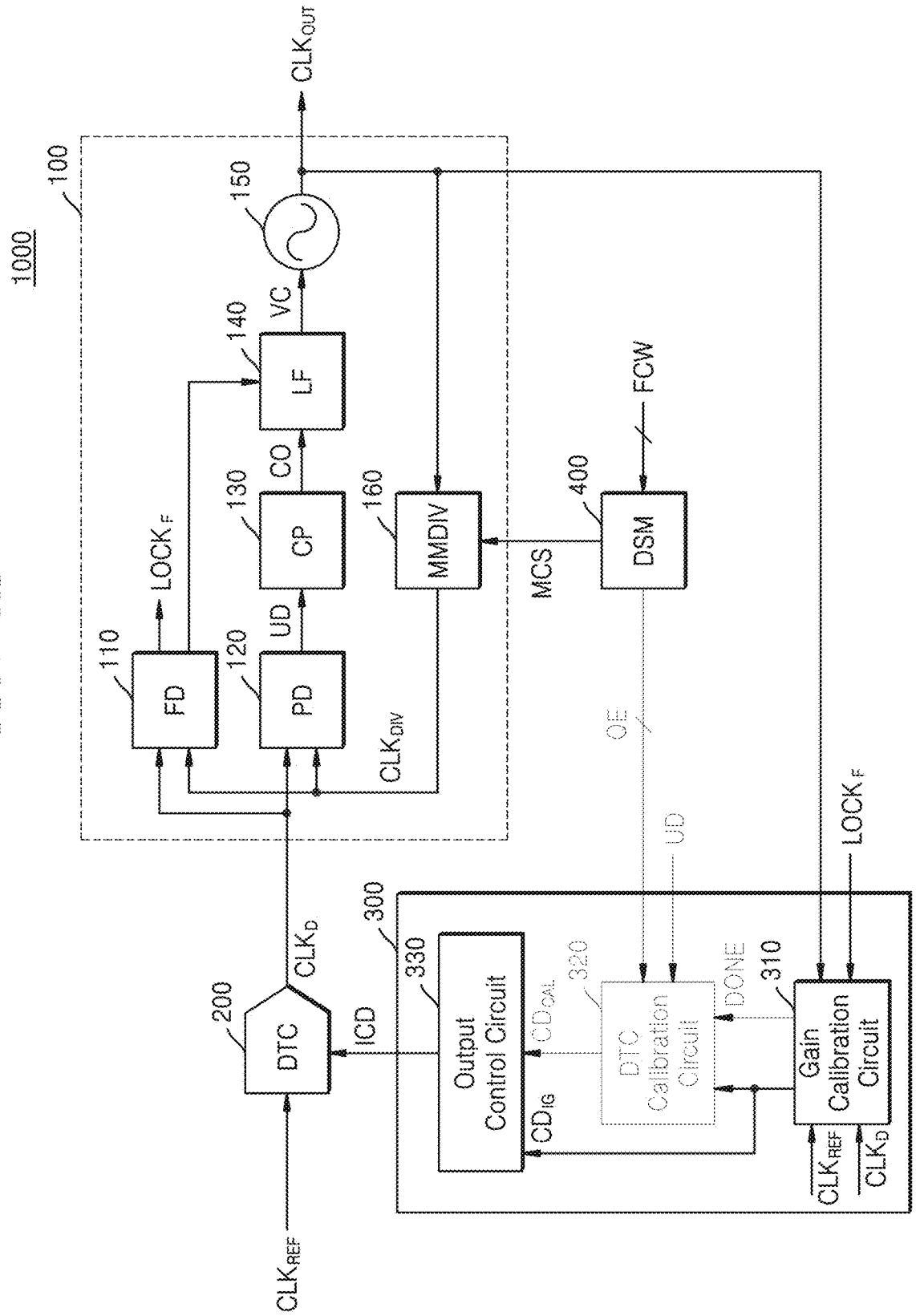
FIGS. 8A and 8B are block diagrams for explaining an output path of the DTC controller in the phase locked loop circuit of FIG. 2.
Figure 8B:
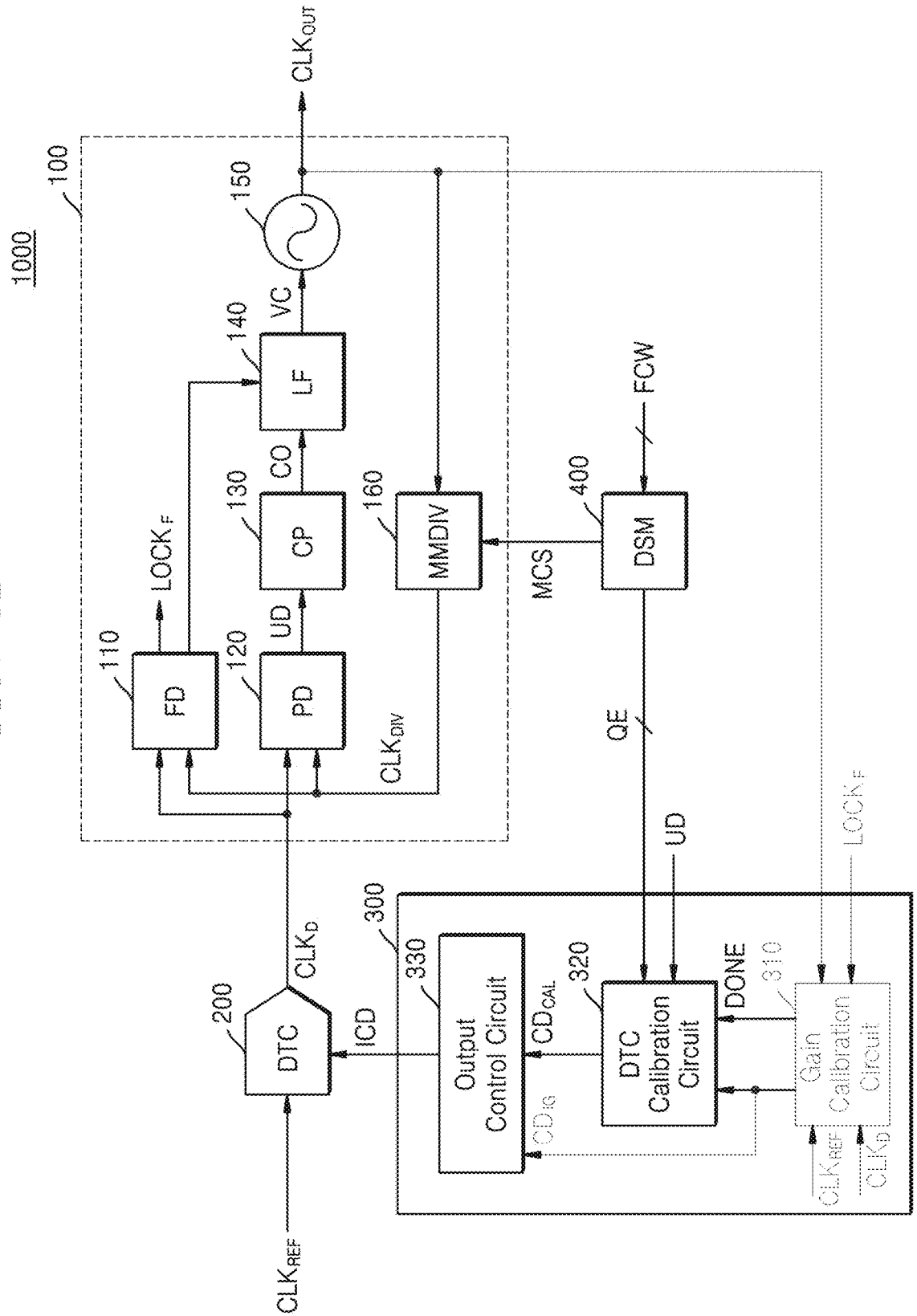

FIGS. 8A and 8B are block diagrams for explaining an output path of the DTC controller 300 in the phase locked loop circuit 1000 of FIG. 2.

Referring to FIG. 8A, the gain calibration circuit 310 may perform the binary search operation in response to the frequency lock signal $LOCK_F$ that is activated. Accordingly, the gain calibration circuit 310 may calibrate the initial gain value $CD_{IG}$ and may provide the initial gain value $CD_{IG}$ as the input code ICD of the DTC 200 under the control of the output control circuit 330. In this case, the DTC calibration circuit 320 may be disabled and may not be driven.

Referring to FIG. 8B, the DTC calibration circuit 320 may be driven in response to the completion signal DONE output from the gain calibration circuit 310. In this case, the phase locked loop circuit 1000 may perform the fine locking operation, and the DTC calibration circuit 320 may generate the control code value $CD_{CAL}$ used to calibrate the delay amount of the DTC 200 to correspond to the QE and may provide the control code value $CD_{CAL}$ as the input code ICD of the DTC 200 under the control of the output control circuit 330. In this case, after providing the DTC calibration circuit 320 with the initial gain value $CD_{IG}$ and the completion signal DONE, the gain calibration circuit 310 may be disabled and may not be driven. Also, as discussed further above, when the phase locked loop circuit 1000 performs the coarse locking operation for frequency locking, the gain calibration circuit 310 may not be driven, as shown in FIG. 8B.

Figure 9A:
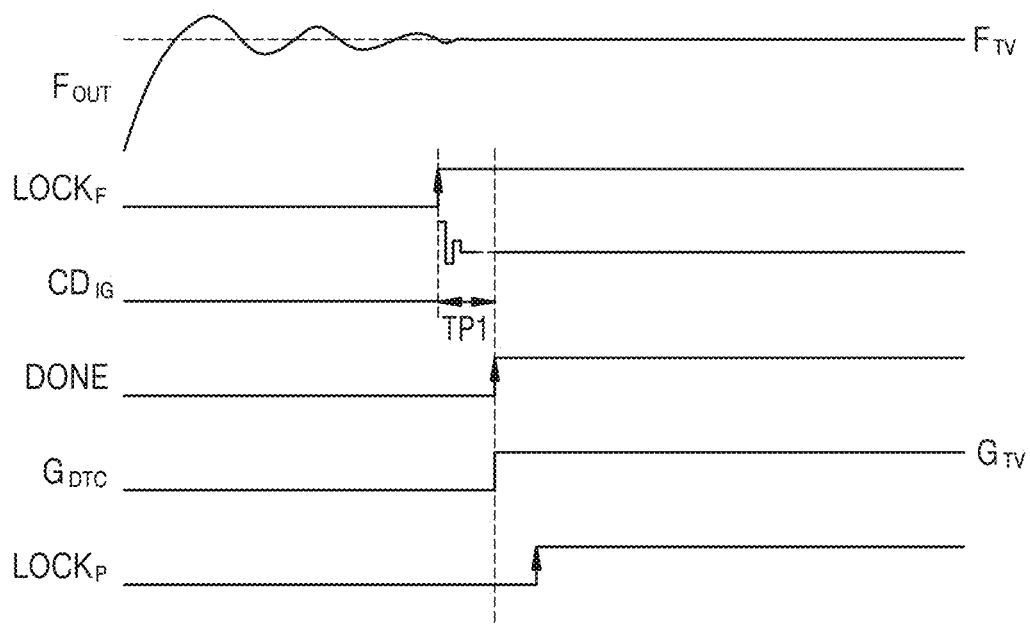
FIG. 9A is a timing diagram showing a locking time of a phase locked loop circuit, according to some example embodiments.
Figure 9B:
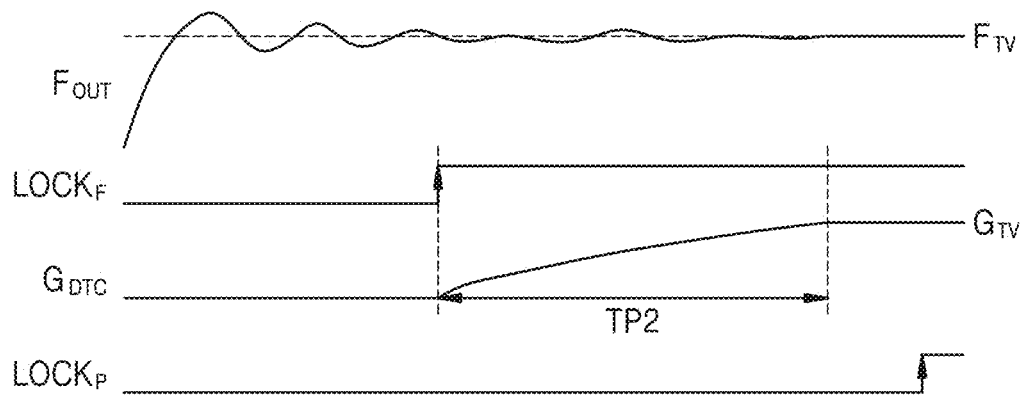
FIG. 9B is a timing diagram showing a locking time according to a comparative example.

FIG. 9A is a timing diagram showing a locking time of a phase locked loop circuit, according to some example embodiments. FIG. 9B is a timing diagram showing a locking time according to a comparative example.

Referring to FIG. 9A, in the phase locked loop circuit (e.g., the phase locked loop circuit 1000 of FIG. 2) according to some example embodiments, when a frequency $F_{OUT}$ of the output clock signal is close to a target frequency $F_{TV}$, the frequency clock signal $LOCK_F$ is generated. For example, the frequency clock signal $LOCK_F$ may be transited from logic low to logic high. The gain calibration circuit 310 of FIG. 2 may be driven in response to the frequency clock signal $LOCK_F$ and may calibrate the initial gain value $CD_{IG}$ by performing the binary search operation based on the binary search algorithm. The gain calibration circuit 310 may be driven in a foreground manner. The binary search operation is performed in an interval TP1, and when the binary search operation is completed, the initial gain value $CD_{IG}$ may be provided as the gain value $G_{DTC}$. Therefore, the gain value $G_{DTC}$ becomes close to a target gain value $G_{TV}$. The DTC calibration circuit 320 of FIG. 2 performs the fine locking operation based on the gain value $G_{DTC}$. The DTC calibration circuit 320 may be driven in a background manner.

Referring to FIG. 9B, a phase locked loop circuit according to a comparative example does not include the gain calibration circuit 310 and may not separately generate the initial gain value $CD_{IG}$.

The phase locked loop circuit according to the comparative example may be driven in a background manner to allow the gain value $G_{DTC}$ to reach the target gain value $G_{TV}$ when the frequency $F_{OUT}$ of the output clock signal becomes close to the target frequency $F_{TV}$. For example, a DTC calibration circuit may generate the gain value $G_{DTC}$ by accumulating the correlation values of the phase difference signal UD and the codes of the QE. Since the correlation values of the phase difference signal UD and the codes of the QE are either +1 or −1, when an initial value of the gain value $G_{DTC}$ is '0', there may be excessive delay for the gain value $G_{DTC}$ to reach the target gain value $G_{TV}$. As shown in the drawing, the gain value $G_{DTC}$ may gradually increase in an interval TP2 and thus may reach the target gain value $G_{TV}$. Upon comparing FIGS. 9A and 9B with each other, the phase locked loop circuit 1000 of FIG. 2 according to some example embodiments may have a relatively short period of time taken to make the gain value $G_{DTC}$ for the operation of the DTC 200 reach the target gain value $G_{TV}$, compared to the phase locked loop circuit according to the comparative example discussed in association with FIG. 9B, and accordingly, the locking time of the phase locked loop circuit 1000 may decrease with respect to the phase locked loop circuit of the comparative example.

Figure 10:
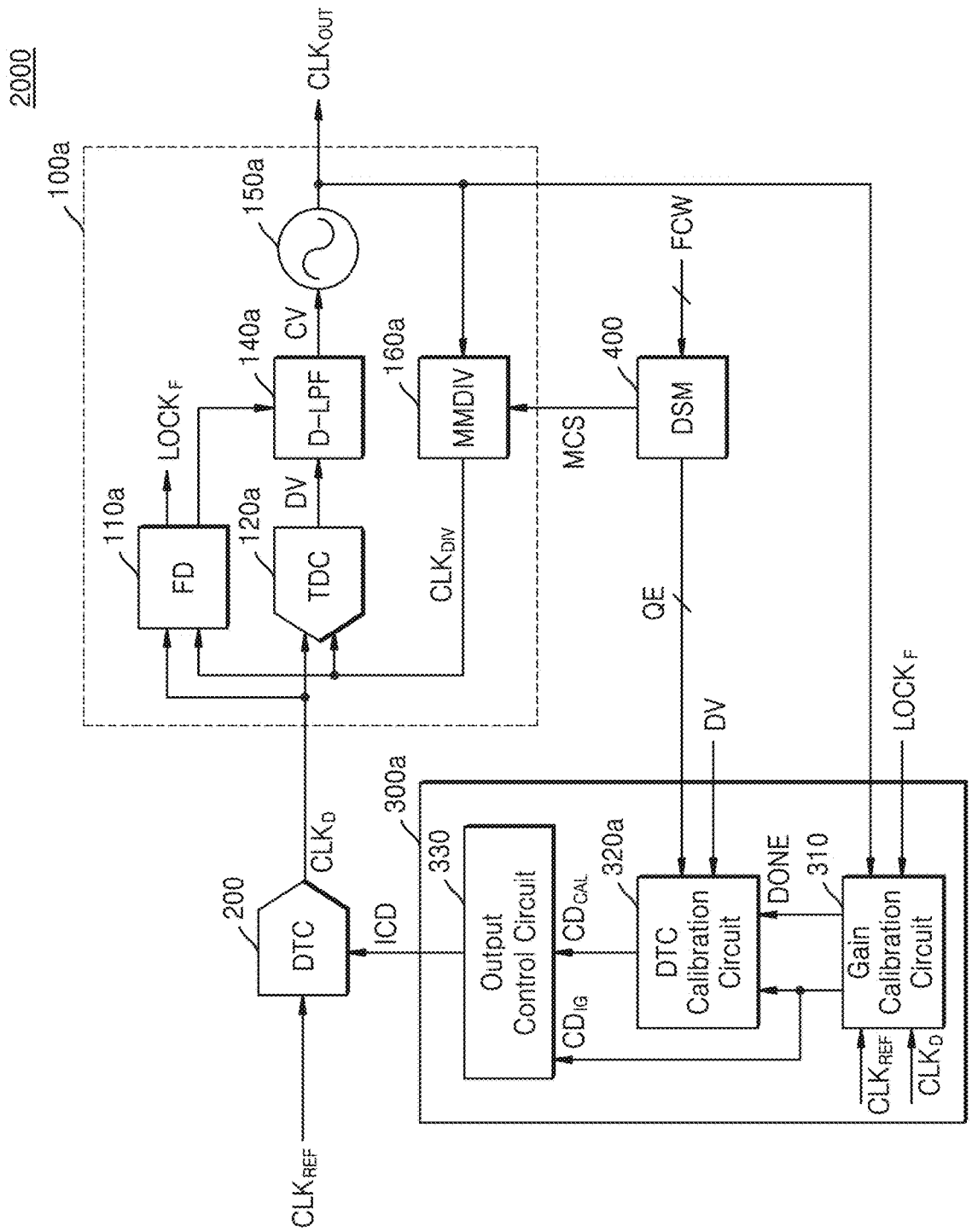
FIG. 10 is a block diagram of a phase locked loop circuit in which the phase detector is embodied as a time-to-digital converter according to some example embodiments.

FIG. 10 is a block diagram of a phase locked loop circuit 2000 in which the phase detector is embodied as a time-to-digital converter according to some example embodiments.

Referring to FIG. 10, the phase locked loop circuit 2000 may include a phase locked loop 100a, the DTC 200, a DTC controller 300a, and the modulator 400. The phase locked loop 100a may be a fractional-N digital phase locked loop, and the phase locked loop circuit 2000 may generate an output clock signal $CLK_{OUT}$ having a frequency N times (where, N is a real number equal to or greater than 1) a frequency of a received reference clock signal $CLK_{REF}$. The DTC 200, the DTC controller 300a, and the modulator 400 may be similar to or the same as the DTC 200, the DTC controller 300, and the modulator discussed in association with FIG. 2.

The phase locked loop 100a may include a frequency detector 110a, a phase detector 120a, a digital loop filter 140a, an oscillator 150a, and a multi-modulus divider 160a. Any or all of the frequency detector 110a, the phase detector 120a, the digital loop filter 140a, the oscillator 150a, and the multi-modulus divider 160a may be embodied, for example, by circuits or circuitry or, alternatively, at least one processor executing program code including instructions corresponding to any or all operations described herein as being performed by the phase locked loop 100a, the frequency detector 110a, the phase detector 120a, the digital loop filter 140a, the oscillator 150a, and the multi-modulus divider 160a.

The frequency detector 110a may detect (e.g., determine) a frequency difference between a division clock signal $CLK_{DIV}$ and a delay clock signal $CLK_D$, and when frequencies of the division clock signal $CLK_{DIV}$ and the delay clock signal $CLK_D$ are identical or similar to each other, a frequency lock signal $LOCK_F$ having an active level may be generated.

The phase detector 120a may be embodied as a time-to-digital converter. The phase detector 120a may detect (e.g., determine) a phase difference between the delay clock signals $CLK_D$ and the division clock signal $CLK_{DIV}$, and may generate a phase difference data value DV corresponding to the phase difference.

The digital loop filter 140a may perform low-pass filtering on the phase difference data value DV and thus may generate a control value CV by filtering noise and high-frequency signals from the phase difference data value DV. The oscillator 150a may generate the output clock signal $CLK_{OUT}$ based on the control value CV.

The operations of the multi-modulus divider 160a and the modulator 400 are identical or similar to the operations of the multi-modulus divider 160 and the modulator 400 of the phase locked loop circuit 1000 which are described with reference to FIG. 2, and thus, repeated descriptions will be omitted herein.

The gain calibration circuit 310 may obtain a delay amount of the DTC 200 based on the reference clock signal $CLK_{REF}$ and the delay clock signal $CLK_D$ and may derive the initial gain value $CD_{IG}$ based on the binary search algorithm, according to a result of comparing the delay amount with one cycle of the output clock signal.

When the completion signal DONE, which indicates that the initial gain value $CD_{IG}$ is derived from the gain calibration circuit 310, is output, the DTC calibration circuit 320a may generate the control code value $CD_{CAL}$ based on the initial gain value $CD_{IG}$ provided along with the completion signal DONE. The DTC calibration circuit 320a may receive the phase difference data value DV from the phase locked loop 100a and the QE from the modulator 400 and may generate the control code value $CD_{CAL}$ based on the initial gain value $CD_{IG}$, the phase difference data value DV, and the QE, and thus, a phase of the output clock signal $CLK_{OUT}$ may be locked to the reference clock signal $CLK_{REF}$.

Figure 11:
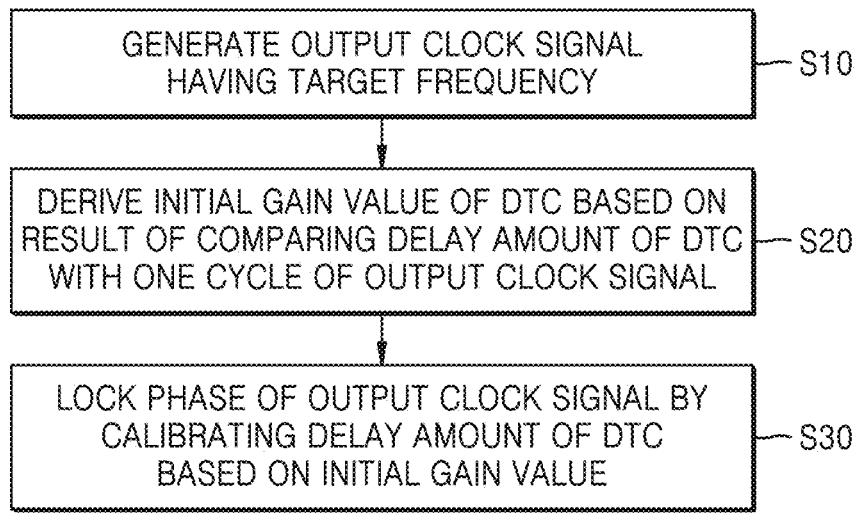
FIG. 11 is a flowchart of a method of operating a phase locked loop circuit, according to some example embodiments.

FIG. 11 is a flowchart of a method of operating a phase locked loop circuit, according to some example embodiments. The method of FIG. 11 is a method of operating a phase locked loop circuit including a DTC and a DTC controller. The method may be applied to the phase locked loop circuits 1000 and 2000 of FIGS. 2 and 10, and the descriptions provided with reference to FIGS. 2 and 10 may be applied to FIG. 11.

Referring to FIGS. 2 and 11, in operation S10, the phase locked loop circuit may generate an output clock signal having a target frequency. The phase locked loop circuit may perform a coarse locking operation, and accordingly, a frequency of the output clock signal may reach the target frequency.

In operation S20, the phase locked loop circuit, in particular, the gain calibration circuit 310 of FIG. 2, may compare a delay amount of the DTC with one cycle of the output clock signal and may derive (e.g., determine) an initial gain value of the DTC based on a comparison result. The gain calibration circuit 310 may perform a binary search operation based on the comparison result and may calibrate the initial gain value of the DTC. The gain calibration circuit 310 may derive, as the initial gain value, a code value used to control the DTC to delay the reference clock signal by as much as a period of time corresponding to one cycle of the output clock signal.

In operation S30, the phase locked loop circuit may lock a phase of the output clock signal by calibrating the delay amount of the DTC based on the initial gain value. In other words, the phase locked loop circuit may perform a fine locking operation based on the initial gain value, and accordingly, the phase of the output clock signal may become similar or identical to that of the reference clock signal (the output clock signal having the target frequency and the same phase as, or a similar phase to, the reference clock signal is also referred to herein as the "target output clock signal").

Figure 12:
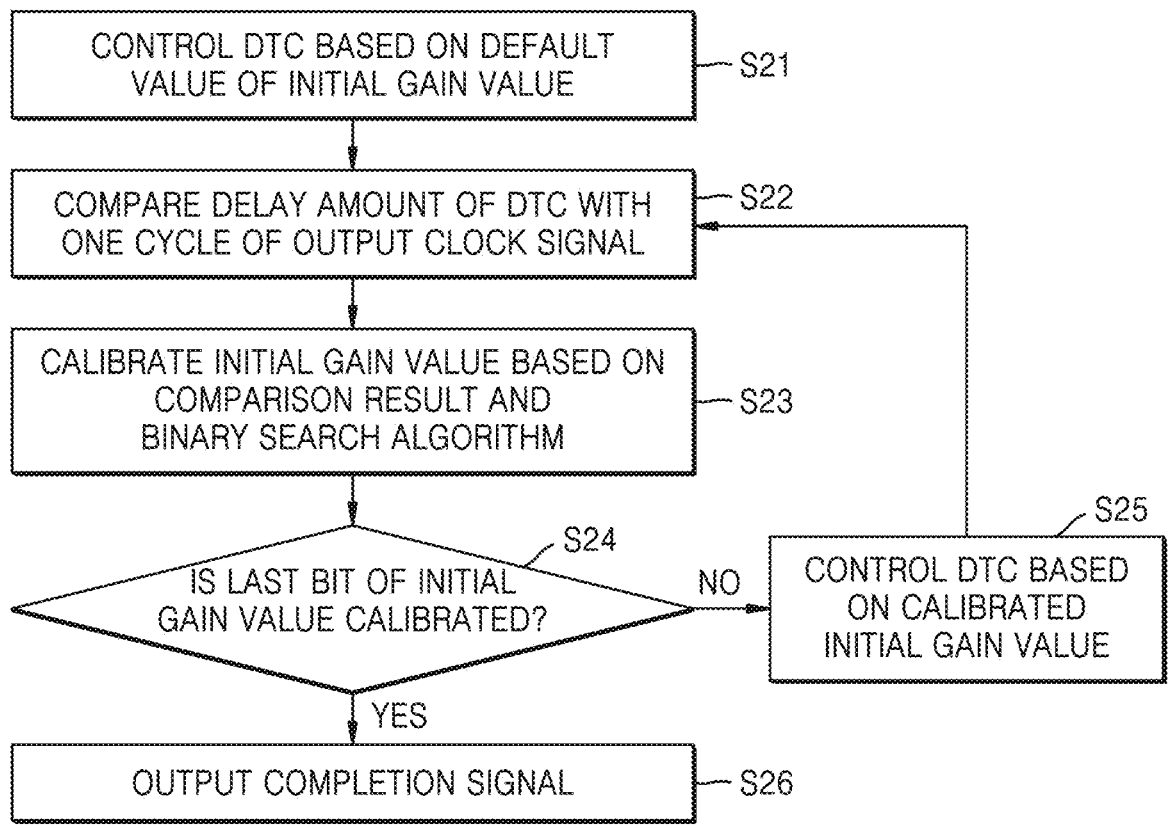
FIG. 12 is a flowchart of an operation of deriving an initial gain value of a DTC of FIG. 11.

FIG. 12 is a flowchart of an operation of deriving the initial gain value of the DTC (e.g., operation S20 of FIG. 11). A method shown in FIG. 12 may be performed by the gain calibration circuit 310 of FIG. 2.

Referring to FIGS. 2 and 11, in operation S21, the gain calibration circuit 310 may control the DTC (e.g., the DTC 200 of FIG. 2) based on a default value of the initial gain value. In some example embodiments, the default value of the initial gain value may be a median of an input code. For example, when the input code is a 5-bit signal, the default value of the initial gain value may be '10000'. The default value of the initial gain value may be provided as the input code. Accordingly, the DTC 200 may generate a delay clock signal that delays the reference clock signal by as much as a delay amount corresponding to the default value of the initial gain value. The gain calibration circuit 310 may set a current bit of the initial gain value to be the most significant bit of the initial gain value.

In operation S22, the gain calibration circuit 310 may compare one cycle of the output clock signal with the delay amount of the DTC 200. For example, the gain calibration circuit 310 may obtain the delay amount of the DTC 200, that is, a temporal difference between the reference clock signal and the delay clock signal and may obtain a pulse signal corresponding to one cycle of the output clock signal. The gain calibration circuit 310 may convert the temporal difference and the pulse signal into a first digital code and a second digital code, respectively, and may compare the first digital code with the second digital code.

In operation S23, the gain calibration circuit 310 may calibrate the current bit of the initial gain value based on a comparison result and the binary search algorithm. The gain calibration circuit 310 may perform a binary search operation based on the comparison result and thus may calibrate the current bit of the initial gain value.

In operation S24, the gain calibration circuit 310 may check whether the least significant bit of the initial gain value is calibrated. When the least significant bit of the initial gain value is not calibrated, the gain calibration circuit 310 may shift the current bit to the next most significant bit, may determine that the binary search operation has not yet been completed, and may control the DTC based on the calibrated initial gain value, in operation S25. Then, the gain calibration circuit 310 may perform operations S22 and S23 and may calibrate the initial gain value.

When the least significant bit of the initial gain value is calibrated, the gain calibration circuit 310 may determine that the binary search operation has been completed and may output a completion signal indicating the completion of the binary search operation, in operation S26.

Figure 13:
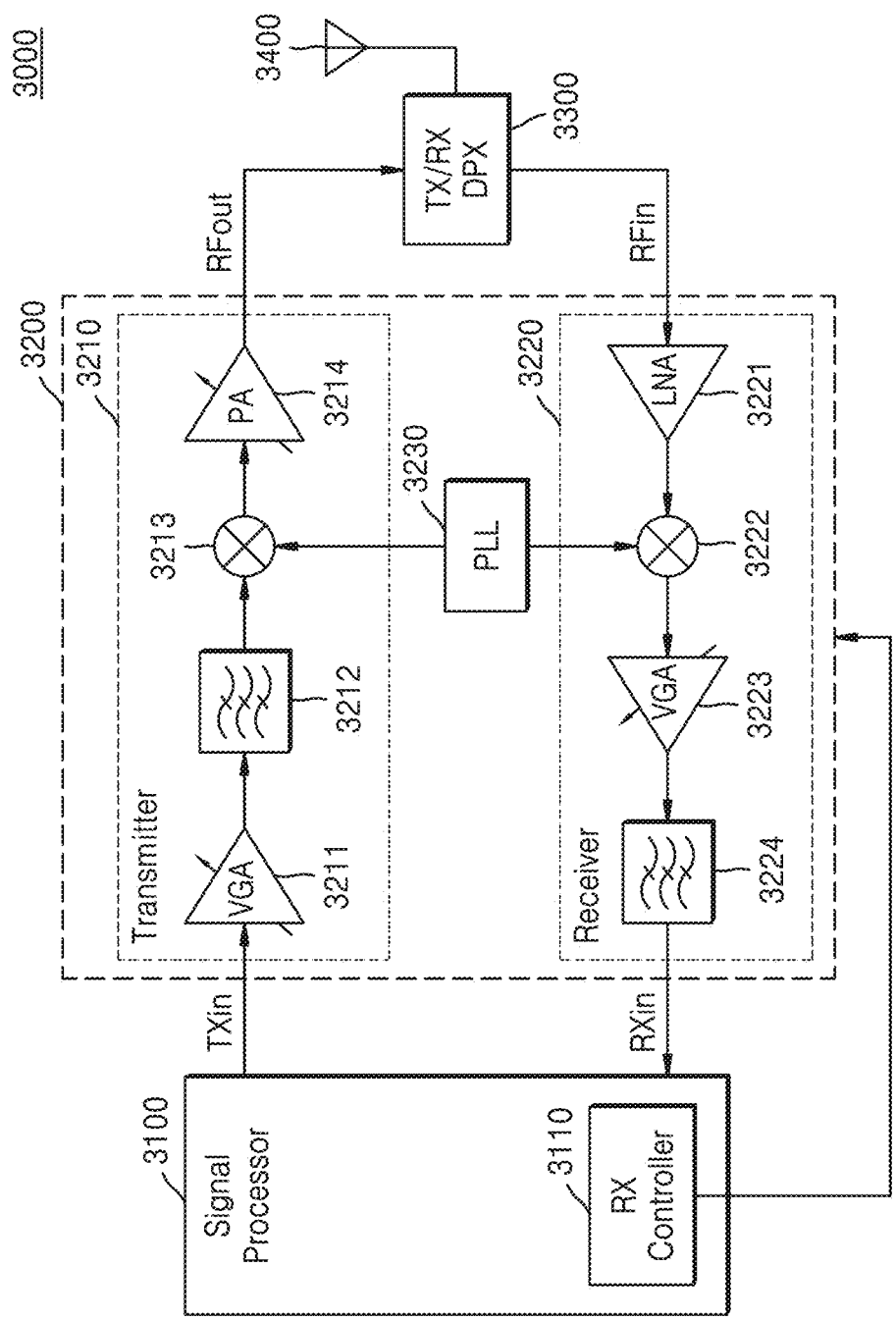
FIG. 13 is a block diagram of a wireless communication device including a phase locked loop circuit, according to some example embodiments.

FIG. 13 is a block diagram of a wireless communication device 3000 including a phase locked loop circuit, according to some example embodiments.

The wireless communication device 3000 may include an antenna 3400 and may transmit and/or receive signals via the antenna 3400 such that the wireless communication device 3000 may communicate with another device (e.g., another wireless communication device, base station, etc.).

A wireless communication system, in which the wireless communication device 3000 communicates with another device, is a non-limiting example, and may be a wireless communication system using a cellular network, for example, a 5$^{th}$ generation (5G) wireless system, a Long Term Evolution (LTE) system, an LTE-Advanced system, a Code Division Multiple Access (CDMA) system, a Global System for Mobile Communications (GSM) system, a Wireless Local Area Network (WLAN) system or another wireless communication system.

As shown in FIG. 13, the wireless communication device 3000 may include a signal processor 3100, a transceiver 3200, a transmitting/receiving duplexer 3300, and the antenna 3400. The transmitting/receiving duplexer 3300 may provide the transceiver 3200 with a signal received via the antenna 3400 as a radio frequency (RF) input signal RFin and/or may provide the antenna 3400 with an RF output signal RFout received from the transceiver 3200.

The signal processor 3100 may process transmitting and/or receiving signals in a base band. The signal processor 3100 may include a controller 3110, and the controller 3110 may control the transceiver 3200. In some example embodiments, the controller 3110 may output a frequency control signal.

The transceiver 3200 may include a transmitter 3210, a receiver 3220, and a phase locked loop circuit 3230. The transmitter 3210 may process a transmission input signal TXin received from the signal processor 3100 and thus may generate the RF output signal RFout. As shown in the drawing, the transmitter 3210 may include a variable gain amplifier 3211, a TX filter 3212, a TX mixer 3213, and a power amplifier 3214 to process the transmission input signal TXin.

The receiver 3220 may process the RF input signal RFin and may generate a receiving input signal RXin, thus providing the generated receiving input signal RXin to the signal processor 3100. The receiver 3220 may include a low noise amplifier 3221, an RX mixer 3222, a variable gain amplifier 3223, and an RX filter 3224 to process the RF input signal RFin. Any or all of the signal processor 3100, the RX controller 3110, the variable gain amplifier 3211, the TX filter 3212, the TX mixer 3213, the power amplifier 3214, the low noise amplifier 3221, the RX mixer 3222, the variable gain amplifier 3223, the RX filter 3224, and the transmitting/receiving duplexer 3300 may be embodied, for example, by circuits or circuitry or, alternatively, at least one processor executing program code including instructions corresponding to any or all operations described herein as being performed by the wireless communication device 3000, the signal processor 3100, the RX controller 3110, the transceiver 3200, the transmitter 3210, the receiver 3220, the variable gain amplifier 3211, the TX filter 3212, the TX mixer 3213, the power amplifier 3214, the low noise amplifier 3221, the RX mixer 3222, the variable gain amplifier 3223, the RX filter 3224, and the transmitting/receiving duplexer 3300.

The phase locked loop circuit 3230 may generate a local oscillation signal, that is, a clock signal, which provides a frequency for sampling the transmission input signal TXin and the RF input signal RFin. The output clock signal of the phase locked loop circuit 3230 may be provided to the TX mixer 3213 of the transmitter 3210 and the RX mixer 3222 of the receiver 3220.

The clock signal generator 10 and the phase locked loop circuits 1000 and 2000 according to some example embodiments which are described with reference to FIGS. 1 to 12 may be applied to the phase locked loop circuit 3230 of FIG. 13. The phase locked loop circuit 3230 may include a DTC, which generates a delay clock signal by delaying a reference clock signal by as much as a delay amount corresponding to an input code, and a DTC controller for controlling the delay amount of the DTC. The phase locked loop circuit 3230 may generate the output clock signal based on the delay clock signal. The phase locked loop circuit 3230 may change a frequency of the output clock signal in response to a received frequency control signal. The DTC controller may quickly derive an initial gain value used to set the delay amount to be similar or identical to one cycle of the output clock signal, based on the binary search algorithm and a result of comparing the delay amount of the DTC with one cycle of the output clock signal. The DTC controller may control the delay amount of the DTC based on the initial gain value. Accordingly, when a frequency of the output clock signal is changed, a locking time of the phase locked loop circuit 3230 may decrease.

The transceiver 3200 may allow the transmitter 3210 and the receiver 3220 to time-serially process transmitting and/or receiving signals, according to a time-serial duplexing mode. In this case, frequencies of the transmitting signal and the receiving signal, that is, the RF output signal RFout and the RF input signal RFin, may differ. Since the locking time of the phase locked loop circuit 3230 according to some example embodiments is short, the frequency of the output clock signal may be quickly changed to a target frequency. For example, the phase locked loop circuit 3230 may quickly change the frequency of the output clock signal from a transmission frequency to a receiving frequency, or from the receiving frequency to the transmission frequency.

While the inventive concepts have been particularly shown and described with reference to some example embodiments thereof, it will be understood that various changes in form and details may be made therein without departing from the spirit and scope of the following claims.

What is claimed is:

1. A controller configured to adjust a delay amount of a digital-to-time converter (DTC), the DTC configured to delay a reference clock signal based on an input code to generate a delay clock signal and provide the delay clock signal to a signal generation circuit, the controller comprising:
   a gain calibration circuit configured to determine an initial gain value of the DTC based on the reference clock signal, the delay clock signal, and an output clock signal of the signal generation circuit;
   a DTC calibration circuit configured to generate a control code value based on the initial gain value, the control code value varying according to a control signal from the signal generation circuit; and an output control circuit configured to output one of the initial gain value or the control code value as the input code to the DTC.

2. The controller of claim 1, wherein the initial gain value indicates a code value for adjusting the delay amount to be substantially equal to one period of the output clock signal.

3. The controller of claim 1, wherein the gain calibration circuit comprises:
- a first time-to-digital conversion circuit configured to
  - obtain a first phase difference between the reference clock signal and the delay clock signal, and
  - convert the first phase difference into a first code;
- a second time-to-digital conversion circuit configured to
  - obtain a period of the output clock signal, and
  - convert the period of the output clock signal into a second code;
- a comparator configured to compare the first code and the second code to obtain a comparison result; and
- a decoder configured to determine the initial gain value by performing a binary search operation based on the comparison result.

4. The controller of claim 3, wherein
the first time-to-digital conversion circuit comprises:
- a logic circuit configured to
  - receive the reference clock signal and the delay clock signal, and
  - generate a temporal difference signal representing a time interval corresponding to the first phase difference, and
- a first time-to-digital converter configured to generate the first code based on the temporal difference signal; and
the second time-to-digital conversion circuit comprises:
- a pulse generator configured to generate a pulse signal representing the period of the output clock signal based on a rising edge or a falling edge of the output clock signal, and
- a second time-to-digital converter configured to generate the second code based on the pulse signal.

5. The controller of claim 1, wherein the gain calibration circuit is configured to determine the initial gain value in response to a frequency lock signal indicating that a frequency of the output clock signal is locked to a target frequency.

6. The controller of claim 1, wherein the gain calibration circuit is configured to output a completion signal when the initial gain value is determined, the DTC calibration circuit is configured to generate the control code value based on the completion signal, and the output control circuit is configured to outputs the control code value as the input code to the DTC based on the completion signal.

7. The controller of claim 1, wherein the control signal comprises:
- a second phase difference between a division clock signal and the delay clock signal, the division clock signal being generated by dividing the output clock signal based on a integer division ratio; and
- a quantization error value representing a quantization error occurring according to a change of the integer division ratio.

8. The controller of claim 7, wherein the DTC calibration circuit comprises:
- a correlation circuit configured to output a plurality of correlation values, the plurality of correlation values indicating correlations of signs of the second phase difference and signs of the quantization error value;
- an integrator configured to generate a calibrated gain value by accumulating the plurality of correlation values and the initial gain value; and
- a multiplier configured to generate the control code values by multiplying the calibrated gain value by the quantization error value.

9. The controller of claim 8, wherein the integrator comprises:
- a flip-flop configured to
  - store the initial gain value as an initial value, and
  - output the calibrated gain value; and
- an adder configured to
  - add a correlation value among the plurality of correlation values to the calibrated gain value from the flip-flop to obtain an addition value, and
  - provide the addition value as an input to the flip-flop.

10. The controller of claim 1, wherein the output control circuit is configured to:
- output the initial gain value as the input code in a first period after the output clock signal reaches a target frequency, and
- output the control code value as the input code in a second period subsequent to the first period.

11. The controller of claim 1, wherein the output control circuit comprises:
- a selection signal generator configured to generate a selection signal based on a frequency lock signal and a completion signal, the frequency lock signal indicating that a frequency of the output clock signal is locked to a target frequency, and the completion signal indicating that the initial gain value is determined; and
- a selector configured to select one of the initial gain value or the control code value as the input code based on the selection signal.

12. The controller of claim 11, wherein the selection signal generator is configured to:
- generate the selection signal having a first level for selecting the initial gain value in response to an activation level of the frequency lock signal and an inactivation level of the completion signal; and
- generate the selection signal having a second level for selecting the control code value in response to an inactivation level of the frequency lock signal or an activation level of the completion signal.

13. The controller of claim 1, wherein the signal generation circuit comprises a fractional-N phase locked loop.

14. A method of operating a phase locked loop circuit comprising a digital-to-time converter (DTC) configured to delay a reference clock signal to provide an input clock signal, the method comprising:
- locking a frequency of a output clock signal of the phase locked loop circuit to a target frequency;
- determining an initial gain value of the DTC based on
  - a temporal difference between the reference clock signal and the input clock signal, and
  - a period of the output clock signal; and
- locking a phase of the output clock signal to a phase of the reference clock signal by calibrating a delay amount of the DTC based on the initial gain value.

15. The method of claim 14, wherein the locking the frequency of the output clock signal comprises:
- detecting a frequency difference between a division clock signal of the output clock signal and the input clock signal to obtain a detection result; and
- controlling the frequency of the output clock signal based on the detection result such that a frequency of the division clock signal is substantially equal to a frequency of the input clock signal.

16. The method of claim 14, wherein the determining of the initial gain value comprises:
obtaining the temporal difference between the reference clock signal and the input clock signal;
obtaining a pulse signal corresponding to the period of the output clock signal;
converting the temporal difference into a first digital code;
converting the pulse signal into a second digital code;
comparing respective values of the first digital code with the second digital code; and
calibrating the initial gain value by performing a binary search operation based on the comparing the respective values.

17. The method of claim 16, wherein the determining the initial gain value comprises:
calibrating a delay amount of the DTC based on the initial gain value when a last bit of the initial gain value is not calibrated; and
outputting a binary search completion signal when the last bit of the initial gain value is calibrated.

18. The method of claim 17, wherein the locking the phase of the output clock signal to the phase of the reference clock signal is performed in response to the binary search completion signal.

19. The method of claim 14, wherein the locking the phase of the output clock signal to the phase of the reference clock signal comprises:
generating a plurality of correlation values, the plurality of correlation values indicating correlations of
signs of a phase difference between a division clock signal and the input clock signal, and
signs of a quantization error value,
the division clock signal being generated by dividing the output clock signal based on a integer division ratio, and the quantization error value representing a quantization error occurring according to a change of the integer division ratio;
generating a calibrated gain value by accumulating the plurality of correlation values and the initial gain value; and
generate a control code value to calibrate the delay amount of the DTC by multiplying the calibrated gain value by the quantization error value.

20. The method of claim 14, wherein the determining the initial gain value is performed in response to a frequency lock signal indicating that the frequency of the output clock signal is locked to the target frequency.

* * * * *